(12) United States Patent
Noh et al.

(10) Patent No.: US 12,398,275 B2
(45) Date of Patent: Aug. 26, 2025

(54) GROUP V ELEMENT-CONTAINING FILM COMPOSITIONS AND VAPOR DEPOSITION OF GROUP V ELEMENT-CONTAINING FILM

(71) Applicant: L'Air Liquide, Société Anonyme pour l'Etude et l'Exploitation des Procédés Georges Claude, Paris (FR)

(72) Inventors: Wontae Noh, Seoul (KR); Jooho Lee, Seoul (KR)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 519 days.

(21) Appl. No.: 16/720,537

(22) Filed: Dec. 19, 2019

(65) Prior Publication Data

US 2021/0189145 A1    Jun. 24, 2021

(51) Int. Cl.
*C09D 1/00*    (2006.01)
*C01G 33/00*   (2006.01)
(Continued)

(52) U.S. Cl.
CPC .............. *C09D 1/00* (2013.01); *C01G 33/006* (2013.01); *C07F 17/00* (2013.01); *C23C 16/405* (2013.01);
(Continued)

(58) Field of Classification Search
CPC ............ C23C 16/405; C23C 16/45536; C23C 16/45553; C01G 33/006
See application file for complete search history.

(56) References Cited

U.S. PATENT DOCUMENTS 6,491,978 B1    12/2002    Kalyanam
9,786,671 B2    10/2017    Lansalot-Matras et al.
(Continued)

FOREIGN PATENT DOCUMENTS

WO    WO 2009 087609    7/2009

OTHER PUBLICATIONS

International Search Report and Written Opinion for corresponding PCT/US/2020/066054, Apr. 20, 2021.
(Continued)

*Primary Examiner* — Robert S Walters, Jr.
(74) *Attorney, Agent, or Firm* — Yan Jiang

(57) ABSTRACT

Methods for forming a Group V-containing film comprise:
a) exposing a substrate to a vapor of a Group V-containing film forming composition;
b) exposing the substrate to a co-reactant; and
c) repeating the steps of a) and b) until a desired thickness of the Group V-containing film is deposited on the substrate using a vapor deposition process,
wherein the Group V-containing film forming composition comprises a precursor having the formula:

(Continued)

wherein M is a Group V (five) element selected from V, Nb, or Ta; R is H, Me, Et, nPr, iPr, nBu, sBu, iBu, tBu, n-pentyl, i-pentyl, neo-pentyl, or tert-amyl; each $R^1$, $R^2$, $R^3$ is independently H, an alkyl group, or a —SiR's group, with each R' independently being H or an alkyl group; and each $R^{11}$, $R^{12}$, $R^{13}$, $R^{14}$, $R^{15}$ is independently H, Me, Et, nPr, iPr, nBu, sBu, IBu, or tBu. Methods for deposition of a $LiNbO_3$ film on a powder are disclosed.

17 Claims, 9 Drawing Sheets

(51) Int. Cl.
    *C07F 17/00*     (2006.01)
    *C23C 16/40*     (2006.01)
    *C23C 16/455*     (2006.01)

(52) U.S. Cl.
    CPC .. *C23C 16/45536* (2013.01); *C23C 16/45553* (2013.01); *C01P 2004/03* (2013.01); *C01P 2004/84* (2013.01)

(56) References Cited

U.S. PATENT DOCUMENTS

| | | | |
|---|---|---|---|
| 10,174,423 | B2 | 1/2019 | Lansalot-Matras et al. |
| 2010/0021747 | A1 | 1/2010 | Dussarrat |
| 2015/0353588 | A1 | 12/2015 | Asano et al. |
| 2016/0307904 | A1* | 10/2016 | Lansalot-Matras .................... H01G 13/003 |
| 2017/0107618 | A1 | 4/2017 | Gatineau et al. |
| 2017/0298511 | A1* | 10/2017 | Lansalot-Matras ....... C07F 9/00 |
| 2019/0379056 | A1* | 12/2019 | Chen ................... H01M 4/366 |

OTHER PUBLICATIONS

Alen, P. et al., The growth and diffusion barrier properties of atomic layer deposited $NbN_x$ thin films, Thin Solid Films 491 (2005) 235-241.

Dezelah, C.L. et al., A pyrazolate-based metalorganic tantalum precursor that exhibits high thermal stability and its use in the atomic layer deposition of $Ta_2O_5$, Journal of American Chemical Society, 2007, 129, 12370-12371.

Elers, K.-E. et al., $NbCl_5$ as a precursor in atomic layer epitaxy, Applied Surface Science 82/83 (1994) 468-474.

Elorriaga, D. et al., Asymmetric niobium guanidinates as intermediates in the catalytic guanylation of amines, Dalton Transactions, 2013, 42, 8223-8230.

Gilmore, C.M. et al., Stabilized zirconia-alumina thin films, J. Vac. Sci. Technol A 4 (6), Nov./Dec. 1986, 2598-2600.

Gust, K..R. et al., Synthesis, structure, and properties of niobium and tantalum imido complexes bearing pyrazolato ligands. Crystal structures of $Ta(Nt-Bu)(t-Bu_2Pz)_3$, $Ta(Ni-Pr)(t-Bu_2Pz)_3$, $Ta(Nt-Bu)(Me_2Pz)_3(py)$, and $Ta(Nt-Bu)(t-Bu_2Pz)_2(Cl)(py)$, Polyhedron 20 (2001) 805-813.

Kittl, J.A. et al., High-k dielectrics for future generation memory devices, Microelectronic Engineering 86 (2009) 1789-1795.

Perera, T.H. et al., Metallapyrimidines and metallapyrimidiniums from oxidative addition of pyrazolate N—N bonds to niobium(III), niobium(IV), and tantalum(IV) metal centers and assessment of their aromatic character, Organometallics, 2012, 31, 5971-5974.

Ritala, M. et al., Effects of intermediate zinc pulses on properties of TiN and NbN films deposited by atomic layer epitaxy, Applied Surface Science 120 (1997) 199-212.

Tomson, N.C. et al., Synthesis and reactivity of cationic niobium and tantalum methyl complexes supported by imido and ß-diketiminato ligands, Dalton Transactions 2011 vol. 40, Issue 30, 7718-7729.

* cited by examiner

GROUP V ELEMENT-CONTAINING FILM COMPOSITIONS AND VAPOR DEPOSITION OF GROUP V ELEMENT-CONTAINING FILM

TECHNICAL FIELD

The present invention relates to Group V (five) element-containing film forming compositions, methods of synthesizing the same, and methods of using the same to deposit Group V (five) element-containing films on substrates via vapor deposition processes.

BACKGROUND

Metal oxide films are promising candidates for the use in all kinds of electronic and optic devices, due to their unique combination of high electrical conductivity, low electrical resistivity, and high optical transmittance. Group V (five) element-containing oxide films have been extensively utilized in various fields of semiconductor industry. Traditionally these oxides have been applied as resistive films used as high-k materials for insulating layers. For instance, a thin layer of $Nb_2O_5$ between two $ZrO_2$ dielectric layers is expected to help significantly reduce leakage current and stabilize the cubic/tetragonal phase of the $ZrO_2$, affording higher k values in the current MIM capacitor of a DRAM (Alumina, J. Vac. Sci. Technol A 4 (6), 1986 and Microelectronic Engineering 86 (2009) 1789-1795).

Metal Nitride films, such as Niobium Nitride (NbN) have been extensively utilized in various fields of technology. Traditionally these nitrides have been applied as hard and decorative coatings but during the past decade they have increasingly been used as diffusion barrier and adhesion/glue layers in microelectronic devices (Applied Surface Science 120 (1997) 199-212). $NbCl_5$ for instance has been examined as a niobium source for Atomic Layer Epitaxial growth of NbN, but the process required Zn as a reducing agent (Applied Surface Science 82/83 (1994) 468-474). NbN films were also deposited by atomic layer deposition (ALD) using $NbCl_5$ and $NH_3$ (Thin Solid Films 491 (2005) 235-241). The chlorine content showed strong temperature dependence as the film deposited at 500° C. was almost chlorine free, while the chlorine content was 8% when the deposition temperature was as low as 250° C. The high melting point of $NbCl_5$ also makes this precursor difficult to use in the vapor deposition process.

Gust et al. disclose the synthesis, structure, and properties of niobium and tantalum imido complexes bearing pyrazolato ligands and their potential use for the growth of tantalum nitride films by CVD (Polyhedron 20 (2001) 805-813).

Elorriaga et al. disclose asymmetric niobium guanidinates as intermediates in the catalytic guanylation of amines (Dalton Transactions, 2013, Vol. 42, Issue 23 pp. 8223-8230).

Tomson et al. disclose the synthesis and reactivity of the cationic Nb and Ta monomethyl complexes [(BDI)MeM (NtBu)][X](BDI=2,6-$iPr_2C_6H_3$—N—C(Me)CH—C(Me)—N(2,6-$iPr_2C_6H_3$); X=MeB$(C_6F_5)_3$ or B $(C_6F_5)_4$) (Dalton Transactions 2011 Vol. 40, Issue 30, pp. 7718-7729).

U.S. Pat. No. 10,174,423 to Lansalot-Matras et al. discloses forming Nb-containing films using niobium pyrazolates, Nb(=NR)(R'$_2$-Pyz)$_3$ precursors.

A pyrazolate complex Ta(=NtBu)(tBu$_2$-Pyz)$_3$ for ALD of $Ta_2O_5$ with ozone has been studied (Journal of American Chemical Society, 2007, 129, 12370-12371). The results show exceptional thermal stability which leads to high ALD windows from 300 to 450° C. with a growth rate of 0.31 Å/cycle. The analyses of $Ta_2O_5$ showed low impurities (C, H, N) incorporated into formed films. Afterwards, a pyrazolate containing niobium and tantalum compounds, M(tBu$_2$-Pyz)$_2$ (tBu$_2$-NacNac) was published, but they did not report any depositions using those compounds (Organometallics, 2012, 31,5971-5974).

A need remains for developing liquid or low melting point (<50° C. at standard pressure), highly thermally stable, metal-containing precursor molecules, especially Group V containing precursors, suitable for vapor phase film deposition with controlled thickness and composition.

SUMMARY

Disclosed is a method for forming a Group V (five) element-containing film, the method comprising the steps of:

a) exposing a substrate to a vapor of a Group V (five) element-containing film forming composition;

b) exposing the substrate to a co-reactant; and c) repeating the steps of a) and b) until a desired thickness of the Group V (five) element-containing film is deposited on the substrate using a vapor deposition process, wherein the Group V (five) element-containing film forming composition comprises a precursor having the formula:

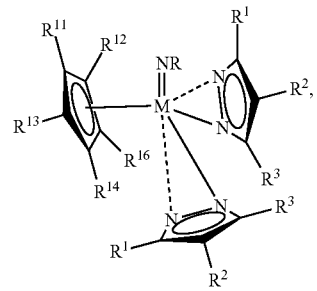

wherein M is a Group V (five) element, V, Nb, Ta; R is H, Me, Et, nPr, iPr, nBu, sBu, iBu, tBu, n-pentyl, i-pentyl, neo-pentyl, tert-amyl; each $R^1$, $R^2$, $R^3$ is independently H, an alkyl group, a —SiR's group with each R' independently being H or an alkyl group; and each $R^{11}$, $R^{12}$, $R^{13}$, $R^{14}$, $R^{15}$ is independently H, Me, Et, nPr, iPr, nBu, sBu, iBu, or tBu.

Also, the disclosed is a method of forming a Li-Group V-$O_3$ film or coating by an ALD process on a substrate, the method comprising the steps of:

i) exposing the substrate to a vapor of a Group V (five) element-containing film forming composition;

ii) exposing the substrate to an oxidizer;

iii) exposing the substrate to a lithium-containing precursor;

iv) exposing the substrate to the oxidizer; and v) repeating the steps of a) and d) until a desired thickness of the Li-Group V-$O_3$ film is deposited on the substrate using the ALD process, wherein the Group V (five) element-containing film forming composition comprises a precursor having the formula:

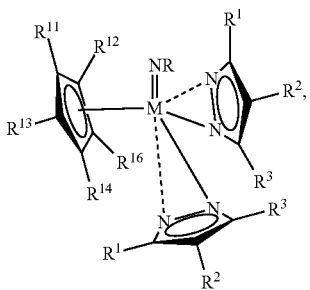

wherein M is a Group V (five) element, V, Nb, Ta; R is H, Me, Et, nPr, iPr, nBu, sBu, iBu, tBu, n-pentyl, i-pentyl, neo-pentyl, or tert-amyl; each $R^1$, $R^2$, $R^3$ is independently H, an alkyl group, a —$SiR'$s group with each R' independently being H, an alkyl group; and each $R^{11}$, $R^{12}$, $R^{13}$, $R^{14}$, $R^{15}$ is independently H, Me, Et, nPr, iPr, nBu, sBu, iBu, or tBu.

In specific embodiments the lithium-containing precursor is selected from the group consisting of LiOtBu, $LiN(SiR_3)_2$ wherein each R is selected from H, a $C_1$ to $C_4$ alkyl or alkenyl group, and Li(DPM) (lithium dipivaloylmethane aka lithium 2,2,6,6-tetramethyl-3,5-heptanedionate).

The disclosed methods may include one or more of the following aspects:
- the method further comprising the steps of introducing an inert gas purge following the steps a) and b), respectively, to separate each exposure;
- the method further comprising the steps of plasma treating the co-reactant;
- the method further comprising the steps of introducing an inert gas purge following the steps i), ii), iii) and iv), respectively, to separate each exposure;
- the inert gas purge using an inert gas selected from $N_2$, Ar, Kr or Xe;
- the inert gas being $N_2$ or Ar;
- the substrate being a powder;
- the powder containing powder materials including NMC (Lithium Nickel Manganese Cobalt Oxide), LCO (Lithium Cobalt Oxide), LFP (Lithium Iron Phosphate), and other battery cathode materials;
- the powder materials including any suitable battery cathode materials;
- the powder materials including NMC (Lithium Nickel Manganese Cobalt Oxide);
- the powder materials including LCO (Lithium Cobalt Oxide);
- the powder materials including LFP (Lithium Iron Phosphate);
- the lithium-containing precursor being any suitable lithium-containing precursor;
- the lithium-containing precursor being LiOtBu;
- the lithium-containing precursor being $LiN(SiR_3)_2$ wherein each R is selected from H, a $C_1$ to $C_4$ alkyl or alkenyl group;
- the lithium-containing precursor being Li(DPM) (lithium dipivaloylmethane aka lithium 2,2,6,6-tetramethyl-3,5-heptanedionate);
- the co-reactant being selected from the group consisting of $O_2$, $O_3$, $H_2O$, $H_2O_2$, NO, $N_2O$, $NO_2$, oxygen radicals thereof, and mixtures thereof;
- the co-reactant being selected from the group consisting of $H_2$, $H_2CO$, $N_2H_4$, $NH_3$, an amine, a hydrazine $N(SiH_3)_3$, radicals thereof, and mixtures thereof;
- the co-reactant being $O_3$;
- the co-reactant being $NH_3$;
- the Group V (five) element-containing film forming composition comprising the precursor Nb(═NtBu)(MeCp)(iPr,H,iPr-Pyz)$_2$;
- the Group V (five) element-containing film forming composition comprising the precursor Nb(═NtBu)(MeCp)(Me,H,Me-Pyz)$_2$;
- the Group V (five) element-containing film being $Nb_2O_5$;
- the Group V (five) element-containing film being NbN;
- the Group V (five) element-containing film being $LiNbO_3$ film;
- the substrate being a wafer with patterns;
- the substrate being a wafer with holes or trenches having an aspect ratio approximately 2:1 to approximately 200:1;
- the substrate being a wafer with holes or trenches having an aspect ratio approximately 20:1 to approximately 100:1;
- the vapor deposition process being an ALD process;
- the vapor deposition process being a CVD process;
- the vapor deposition process being a PEALD process;
- the vapor deposition process being a spatial ALD process;
- a deposition temperature ranging from approximately 100° C. to approximately 600° C.;
- a deposition temperature ranging from approximately 150° C. to approximately 500° C.

Also, disclosed is a Group V (five) element-containing film forming composition for a vapor deposition process comprising a precursor having the formula:

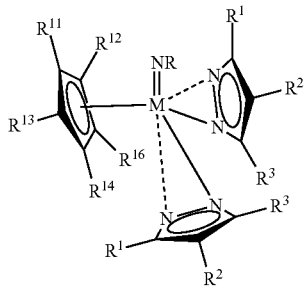

wherein M is Group V (five) element, V, Nb, Ta; R is H, Me, Et, nPr, iPr, nBu, sBu, iBu, tBu, n-pentyl, i-pentyl, neo-pentyl, or tert-amyl; each $R^1$, $R^2$, $R^3$ is independently H, an alkyl group, or a SiR's group, with each R' independently being H or an alkyl group; and each $R^{11}$, $R^{12}$, $R^{13}$, $R^{14}$, $R^{15}$ is independently H, Me, Et, nPr, iPr, nBu, sBu, iBu, or tBu.

The disclosed compositions include one or more of the following aspects:
- each R, $R^1$, $R^2$, $R^3$ being independently H, Me, Et, nPr, iPr, tBu, sBu, iBu, nBu, tAmyl, $SiMe_3$, $SiMe_2H$, or $SiH_2Me$;
- the composition comprising between approximately 95% w/w and approximately 100.0% w/w of the precursor;
- the composition comprising between approximately 0.0% w/w and approximately 5.0% w/w impurities;
- the composition comprising between approximately 0 ppbw and approximately 500 ppbw metal impurities;
- the precursor being Nb(═NtBu)(MeCp)(iPr,H,iPr-Pyz)$_2$;
- the precursor being Nb(═NtBu)(MeCp)(Me,H,Me-Pyz)$_2$;
- the precursor being selected from the group consisting of M(═NMe)Cp(H,H,H-Pyz)$_2$, M(═NMe)Cp(Me,H,H-Pyz)$_2$, M(═NMe)Cp(Me,H,Me-Pyz)$_2$, M(═NMe)Cp (Me,Me,Me-Pyz)$_2$, M(=NMe)Cp(Et,H, Et-Pyz)$_2$, M(=NMe)Cp(nPr,H,nPr-Pyz)$_2$, M(=NMe)Cp(iPr,H, iPr-Pyz)$_2$, M(=NMe)Cp(tBu,H,tBu-Pyz)$_2$, M(=NMe)Cp(iBu,H,iBu-Pyz)$_2$, M(=NMe)Cp(nBu,H, nBu-Pyz)$_2$, M(=NMe)Cp(sBu,H,sBu-Pyz)$_2$, M(=NMe)Cp(tAmyl,H,tAmyl-Pyz)$_2$, M(=NMe)Cp(iPr,H,tBu-Pyz)$_2$, M(=NMe)Cp(iPr,H,Me-Pyz)$_2$, M(=NMe)Cp(iPr,H, Et-Pyz)$_2$, M(=NMe)Cp(TMS,H, TMS-Pyz)$_2$, M(=NMe)Cp(DMS,H,DMS-Pyz)$_2$, M(=NMe)Cp(MMS,H,MMS-Pyz)$_2$, M(=NiPr)Cp(H, H,H-Pyz)$_2$, M(=NiPr)Cp(Me,H,H-Pyz)$_2$, M(=NiPr)Cp(Me,H,Me-Pyz)$_2$, M(=NiPr)Cp(Me,Me,Me-Pyz)$_2$, M(=NiPr)Cp(Et,H, Et-Pyz)$_2$, M(=NiPr)Cp(nPr,H, nPr-Pyz)$_2$, M(=NiPr)Cp(iPr,H,iPr-Pyz)$_2$, M(=NiPr)Cp(tBu,H,tBu-Pyz)$_2$, M(=NiPr)Cp(iBu,H,iBu-Pyz)$_2$, M(=NiPr)Cp(nBu,H,nBu-Pyz)$_2$, M(=NiPr)Cp(sBu, H,sBu-Pyz)$_2$, M(=NiPr)Cp(tAmyl,H,tAmyl-Pyz)$_2$, M(=NiPr)Cp(iPr,H,tBu-Pyz)$_2$, M(=NiPr)Cp(iPr,H, Me-Pyz)$_2$, M(=NiPr)Cp(iPr,H, Et-Pyz)$_2$, M(=NiPr)Cp(TMS,H, TMS-Pyz)$_2$, M(=NiPr)Cp(DMS,H,DMS-Pyz)$_2$, M(=NiPr)Cp(MMS,H,MMS-Pyz)$_2$, M(=NtBu)Cp(H,H,H-Pyz)$_2$, M(=NtBu)Cp(Me,H,H-Pyz)$_2$, M(=NtBu)Cp(Me,H,Me-Pyz)$_2$, M(=NtBu)Cp(Me,Me,Me-Pyz)$_2$, M(=NtBu)Cp(Et,H, Et-Pyz)$_2$, M(=NtBu)Cp(nPr,H,nPr-Pyz)$_2$, M(=NtBu)Cp(iPr,H, iPr-Pyz)$_2$, M(=NtBu)Cp(tBu,H,tBu-Pyz)$_2$, M(=NtBu)Cp(iBu,H,iBu-Pyz)$_2$, M(=NtBu)Cp(nBu, H,nBu-Pyz)$_2$, M(=NtBu)Cp(sBu,H,sBu-Pyz)$_2$, M(=NtBu)Cp(tAmyl,H,tAmyl-Pyz)$_2$, M(=NtBu)Cp(iPr,H,tBu-Pyz)$_2$, M(=NtBu)Cp(iPr,H,Me-Pyz)$_2$, M(=NtBu)Cp(iPr,H, Et-Pyz)$_2$, M(=NtBu)Cp(TMS, H,TMS-Pyz)$_2$, M(=NtBu)Cp(DMS,H,DMS-Pyz)$_2$, M(=NtBu)Cp(MMS,H,MMS-Pyz)$_2$, M(=NtAmyl)Cp(H,H,H-Pyz)$_2$, M(=NtAmyl)Cp(Me,H,H-Pyz)$_2$, M(=NtAmyl)Cp(Me,H,Me-Pyz)$_2$, M(=NtAmyl)Cp(Me,Me,Me-Pyz)$_2$, M(=NtAmyl)Cp(Et,H, Et-Pyz)$_2$, M(=NtAmyl)Cp(nPr,H,nPr-Pyz)$_2$, M(=NtAmyl)Cp(iPr,H,iPr-Pyz)$_2$, M(=NtAmyl)Cp(tBu,H,tBu-Pyz)$_2$, M(=NtAmyl)Cp(iBu,H,iBu-Pyz)$_2$, M(=NtAmyl)Cp(nBu,H,nBu-Pyz)$_2$, M(=NtAmyl)Cp(sBu,H, sBu-Pyz)$_2$, M(=NtAmyl)Cp(tAmyl,H,tAmyl-Pyz)$_2$, M(=NtAmyl)Cp(iPr,H,tBu-Pyz)$_2$, M(=NtAmyl)Cp(iPr,H,Me-Pyz)$_2$, M(=NtAmyl)Cp(iPr,H, Et-Pyz)$_2$, M(=NtAmyl)Cp(TMS,H, TMS-Pyz)$_2$, M(=NtAmyl)Cp(DMS,H,DMS-Pyz)$_2$, M(=NtAmyl)Cp(MMS,H, MMS-Pyz)$_2$, M(=NMe)(MeCp)(H,H,H-Pyz)$_2$, M(=NMe)(MeCp)(Me,H,H-Pyz)$_2$, M(=NMe)(MeCp)(Me,H,Me-Pyz)$_2$, M(=NMe)(MeCp)(Me,Me,Me-Pyz)$_2$, M(=NMe)(MeCp)(Et,H, Et-Pyz)$_2$, M(=NMe)(MeCp)(nPr,H,nPr-Pyz)$_2$, M(=NMe)(MeCp)(iPr,H,iPr-Pyz)$_2$, M(=NMe)(MeCp)(tBu,H, tBu-Pyz)$_2$, M(=NMe)(MeCp)(iBu,H,iBu-Pyz)$_2$, M(=NMe)(MeCp)(nBu,H,nBu-Pyz)$_2$, M(=NMe)(MeCp)(sBu,H,sBu-Pyz)$_2$, M(=NMe)(MeCp)(tAmyl, H,tAmyl-Pyz)$_2$, M(=NMe)(MeCp)(iPr,H,tBu-Pyz)$_2$, M(=NMe)(MeCp)(iPr,H,Me-Pyz)$_2$, M(=NMe)(MeCp)(iPr,H, Et-Pyz)$_2$, M(=NMe)(MeCp)(TMS,H, TMS-Pyz)$_2$, M(=NMe)(MeCp)(DMS,H,DMS-Pyz)$_2$, M(=NMe)(MeCp)(MMS,H,MMS-Pyz)$_2$, M(=NiPr)(MeCp)(H,H,H-Pyz)$_2$, M(=NiPr)(MeCp)(Me,H,H-Pyz)$_2$, M(=NiPr)(MeCp)(Me,H,Me-Pyz)$_2$, M(=NiPr)(MeCp)(Me,Me,Me-Pyz)$_2$, M(=NiPr)(MeCp)(Et,H, Et-Pyz)$_2$, M(=NiPr)(MeCp)(nPr,H,nPr-Pyz)$_2$, M(=NiPr)(MeCp)(iPr,H,iPr-Pyz)$_2$, M(=NiPr)(MeCp)(tBu,H,tBu-Pyz)$_2$, M(=NiPr)(MeCp)(iBu,H, iBu-Pyz)$_2$, M(=NiPr)(MeCp)(nBu,H,nBu-Pyz)$_2$, M(=NiPr)(MeCp)(sBu,H,sBu-Pyz)$_2$, M(=NiPr)(MeCp)(tAmyl,H,tAmyl-Pyz)$_2$, M(=NiPr)(MeCp)(iPr,H,tBu-Pyz)$_2$, M(=NiPr)(MeCp)(iPr,H,Me-Pyz)$_2$, M(=NiPr)(MeCp)(iPr,H, Et-Pyz)$_2$, M(=NiPr)(MeCp)(TMS,H, TMS-Pyz)$_2$, M(=NiPr)(MeCp)(DMS,H, DMS-Pyz)$_2$, M(=NiPr)(MeCp)(MMS,H,MMS-Pyz)$_2$, M(=NtBu)(MeCp)(H,H,H-Pyz)$_2$, M(=NtBu)(MeCp)(Me,H,H-Pyz)$_2$, M(=NtBu)(MeCp)(Me,H,Me-Pyz)$_2$, M(=NtBu)(MeCp)(Me,Me,Me-Pyz)$_2$, M(=NtBu)(MeCp)(Et,H, Et-Pyz)$_2$, M(=NtBu)(MeCp)(nPr,H, nPr-Pyz)$_2$, M(=NtBu)(MeCp)(iPr,H,iPr-Pyz)$_2$, M(=NtBu)(MeCp)(tBu,H,tBu-Pyz)$_2$, M(=NtBu)(MeCp)(iBu,H,iBu-Pyz)$_2$, M(=NtBu)(MeCp)(nBu,H, nBu-Pyz)$_2$, M(=NtBu)(MeCp)(sBu,H,sBu-Pyz)$_2$, M(=NtBu)(MeCp)(tAmyl,H,tAmyl-Pyz)$_2$, M(=NtBu)(MeCp)(iPr,H,tBu-Pyz)$_2$, M(=NtBu)(MeCp)(iPr,H,Me-Pyz)$_2$, M(=NtBu)(MeCp)(iPr,H, Et-Pyz)$_2$, M(=NtBu)(MeCp)(TMS,H, TMS-Pyz)$_2$, M(=NtBu)(MeCp)(DMS,H,DMS-Pyz)$_2$, M(=NtBu)(MeCp)(MMS,H,MMS-Pyz)$_2$, M(=NtAmyl)(MeCp)(H,H,H-Pyz)$_2$, M(=NtAmyl)(MeCp)(Me,H,H-Pyz)$_2$, M(=NtAmyl)(MeCp)(Me,H,Me-Pyz)$_2$, M(=NtAmyl)(MeCp)(Me,Me,Me-Pyz)$_2$, M(=NtAmyl)(MeCp)(Et,H, Et-Pyz)$_2$, M(=NtAmyl)(MeCp)(nPr,H,nPr-Pyz)$_2$, M(=NtAmyl)(MeCp)(iPr,H,iPr-Pyz)$_2$, M(=NtAmyl)(MeCp)(tBu,H,tBu-Pyz)$_2$, M(=NtAmyl)(MeCp)(iBu,H,iBu-Pyz)$_2$, M(=NtAmyl)(MeCp)(nBu,H,nBu-Pyz)$_2$, M(=NtAmyl)(MeCp)(sBu,H,sBu-Pyz)$_2$, M(=NtAmyl)(MeCp)(tAmyl,H,tAmyl-Pyz)$_2$, M(=NtAmyl)(MeCp)(iPr,H,tBu-Pyz)$_2$, M(=NtAmyl)(MeCp)(iPr,H,Me-Pyz)$_2$, M(=NtAmyl)(MeCp)(iPr,H, Et-Pyz)$_2$, M(=NtAmyl)(MeCp)(TMS,H,TMS-Pyz)$_2$, M(=NtAmyl)(MeCp)(DMS,H,DMS-Pyz)$_2$, M(=NtAmyl)(MeCp)(MMS,H,MMS-Pyz)$_2$, M(=NMe)(iPrCp)(H,H,H-Pyz)$_2$, M(=NMe)(iPrCp)(Me,H,H-Pyz)$_2$, M(=NMe)(iPrCp)(Me,H,Me-Pyz)$_2$, M(=NMe)(iPrCp)(Me,Me,Me-Pyz)$_2$, M(=NMe)(iPrCp)(Et,H, Et-Pyz)$_2$, M(=NMe)(iPrCp)(nPr,H,nPr-Pyz)$_2$, M(=NMe)(iPrCp)(iPr,H,iPr-Pyz)$_2$, M(=NMe)(iPrCp)(tBu,H,tBu-Pyz)$_2$, M(=NMe)(iPrCp)(iBu,H, iBu-Pyz)$_2$, M(=NMe)(iPrCp)(nBu,H,nBu-Pyz)$_2$, M(=NMe)(iPrCp)(sBu,H,sBu-Pyz)$_2$, M(=NMe)(iPrCp)(tAmyl,H,tAmyl-Pyz)$_2$, M(=NMe)(iPrCp)(iPr,H, tBu-Pyz)$_2$, M(=NMe)(iPrCp)(iPr,H,Me-Pyz)$_2$, M(=NMe)(iPrCp)(iPr,H, Et-Pyz)$_2$, M(=NMe)(iPrCp)(TMS,H, TMS-Pyz)$_2$, M(=NMe)(iPrCp)(DMS,H, DMS-Pyz)$_2$, M(=NMe)(iPrCp)(MMS,H,MMS-Pyz)$_2$, M(=NiPr)(iPrCp)(H,H,H-Pyz)$_2$, M(=NiPr)(iPrCp)(Me,H,H-Pyz)$_2$, M(=NiPr)(iPrCp)(Me,H,Me-Pyz)$_2$, M(=NiPr)(iPrCp)(Me,Me,Me-Pyz)$_2$, M(=NiPr)(iPrCp)(Et,H, Et-Pyz)$_2$, M(=NiPr)(iPrCp)(nPr,H,nPr-Pyz)$_2$, M(=NiPr)(iPrCp)(iPr,H,iPr-Pyz)$_2$, M(=NiPr)(iPrCp)(tBu,H,tBu-Pyz)$_2$, M(=NiPr)(iPrCp)(iBu,H, iBu-Pyz)$_2$, M(=NiPr)(iPrCp)(nBu,H,nBu-Pyz)$_2$, M(=NiPr)(iPrCp)(sBu,H,sBu-Pyz)$_2$, M(=NiPr)(iPrCp)(tAmyl,H,tAmyl-Pyz)$_2$, M(=NiPr)(iPrCp)(iPr,H, tBu-Pyz)$_2$, M(=NiPr)(iPrCp)(iPr,H,Me-Pyz)$_2$, M(=NiPr)(iPrCp)(iPr,H, Et-Pyz)$_2$, M(=NiPr)(iPrCp)(TMS,H,TMS-Pyz)$_2$, M(=NiPr)(iPrCp)(DMS,H, DMS-Pyz)$_2$, M(=NiPr)(iPrCp)(MMS,H,MMS-Pyz)$_2$, M(=NtBu)(iPrCp)(H,H,H-Pyz)$_2$, M(=NtBu)(iPrCp)(Me,H,H-Pyz)$_2$, M(=NtBu)(iPrCp)(Me,H,Me-Pyz)$_2$, M(=NtBu)(iPrCp)(Me,Me,Me-Pyz)$_2$, M(=NtBu)(iPrCp)(Et,H, Et-Pyz)$_2$, M(=NtBu)(iPrCp)(nPr,H,nPr-Pyz)$_2$, M(=NtBu)(iPrCp)(iPr,H,iPr-Pyz)$_2$, M(=NtBu)(iPrCp)(tBu,H,tBu-Pyz)$_2$, M(=NtBu)(iPrCp)(iBu,H, iBu-Pyz)$_2$, M(=NtBu)(iPrCp)(nBu,H,nBu-Pyz)$_2$, M(=NtBu)(iPrCp)(sBu,H,sBu-Pyz)$_2$, M(=NtBu)(iPrCp)(tAmyl,H,tAmyl-Pyz)$_2$, M(=NtBu)(iPrCp)(iPr,H,tBu-Pyz)$_2$, M(=NtBu)(iPrCp)(iPr,H,Me-Pyz)$_2$, M(=NtBu)(iPrCp)(iPr,H, Et-Pyz)$_2$, M(=NtBu)(iPrCp)(TMS,H,TMS-Pyz)$_2$, M(=NtBu)(iPrCp)(DMS,H,DMS-Pyz)$_2$, M(=NtBu)(iPrCp)(MMS,H,MMS-Pyz)$_2$, M(=NtAmyl)(iPrCp)(H,H,H-Pyz)$_2$, M(=NtAmyl)(iPrCp)(Me,H,H-Pyz)$_2$, M(=NtAmyl)(iPrCp)(Me,H,Me-Pyz)$_2$, M(=NtAmyl)(iPrCp)(Me,Me,Me-Pyz)$_2$, M(=NtAmyl)(iPrCp)(Et,H, Et-Pyz)$_2$, M(=NtAmyl)(iPrCp)(nPr,H,nPr-Pyz)$_2$, M(=NtAmyl)(iPrCp)(iPr,H,iPr-Pyz)$_2$, M(=NtAmyl)(iPrCp)(tBu,H,tBu-Pyz)$_2$, M(=NtAmyl)(iPrCp)(iBu,H,iBu-Pyz)$_2$, M(=NtAmyl)(iPrCp)(nBu,H,nBu-Pyz)$_2$, M(=NtAmyl)(iPrCp)(sBu,H,sBu-Pyz)$_2$, M(=NtAmyl)(iPrCp)(tAmyl, H,tAmyl-Pyz)$_2$, M(=NtAmyl)(iPrCp)(iPr,H,tBu-Pyz)$_2$, M(=NtAmyl)(iPrCp)(iPr,H,Me-Pyz)$_2$, M(=NtAmyl)(iPrCp)(iPr,H, Et-Pyz)$_2$, M(=NtAmyl)(iPrCp)(TMS,H, TMS-Pyz)$_2$, M(=NtAmyl)(iPrCp)(DMS,H,DMS-Pyz)$_2$, M(=NtAmyl)(iPrCp)(MMS,H,MMS-Pyz)$_2$, M(=NMe)(tBuCp)(H,H,H-Pyz)$_2$, M(=NMe)(tBuCp)(Me,H,H-Pyz)$_2$, M(=NMe)(tBuCp)(Me,H,Me-Pyz)$_2$, M(=NMe)(tBuCp)(Me,Me,Me-Pyz)$_2$, M(=NMe)(tBuCp)(Et,H, Et-Pyz)$_2$, M(=NMe)(tBuCp)(nPr,H, nPr-Pyz)$_2$, M(=NMe)(tBuCp)(iPr,H,iPr-Pyz)$_2$, M(=NMe)(tBuCp)(tBu,H,tBu-Pyz)$_2$, M(=NMe)(tBuCp)(iBu,H,iBu-Pyz)$_2$, M(=NMe)(tBuCp)(nBu,H,nBu-Pyz)$_2$, M(=NMe)(tBuCp)(sBu,H,sBu-Pyz)$_2$, M(=NMe)(tBuCp)(tAmyl,H,tAmyl-Pyz)$_2$, M(=NMe)(tBuCp)(iPr,H,tBu-Pyz)$_2$, M(=NMe)(tBuCp)(iPr,H,Me-Pyz)$_2$, M(=NMe)(tBuCp)(iPr,H, Et-Pyz)$_2$, M(=NMe)(tBuCp)(TMS,H, TMS-Pyz)$_2$, M(=NMe)(tBuCp)(DMS,H,DMS-Pyz)$_2$, M(=NMe)(tBuCp)(MMS,H,MMS-Pyz)$_2$, M(=NiPr)(tBuCp)(H,H,H-Pyz)$_2$, M(=NiPr)(tBuCp)(Me,H,H-Pyz)$_2$, M(=NiPr)(tBuCp)(Me,H,Me-Pyz)$_2$, M(=NiPr)(tBuCp)(Me,Me,Me-Pyz)$_2$, M(=NiPr)(tBuCp)(Et,H, Et-Pyz)$_2$, M(=NiPr)(tBuCp)(nPr,H,nPr-Pyz)$_2$, M(=NiPr)(tBuCp)(iPr,H,iPr-Pyz)$_2$, M(=NiPr)(tBuCp)(tBu,H,tBu-Pyz)$_2$, M(=NiPr)(tBuCp)(iBu,H,iBu-Pyz)$_2$, M(=NiPr)(tBuCp)(nBu,H,nBu-Pyz)$_2$, M(=NiPr)(tBuCp)(sBu,H,sBu-Pyz)$_2$, M(=NiPr)(tBuCp)(tAmyl,H,tAmyl-Pyz)$_2$, M(=NiPr)(tBuCp)(iPr,H,tBu-Pyz)$_2$, M(=NiPr)(tBuCp)(iPr,H,Me-Pyz)$_2$, M(=NiPr)(tBuCp)(iPr,H, Et-Pyz)$_2$, M(=NiPr)(tBuCp)(TMS,H, TMS-Pyz)$_2$, M(=NiPr)(tBuCp)(DMS,H,DMS-Pyz)$_2$, M(=NiPr)(tBuCp)(MMS,H,MMS-Pyz)$_2$, M(=NtBu)(*BuCp)(H,H,H-Pyz)$_2$, M(=NtBu)(tBuCp)(Me,H,H-Pyz)$_2$, M(=NtBu)(tBuCp)(Me,H,Me-Pyz)$_2$, M(=NtBu)(tBuCp)(Me,Me,Me-Pyz)$_2$, M(=NtBu)(tBuCp)(Et,H, Et-Pyz)$_2$, M(=NtBu)(tBuCp)(nPr,H,nPr-Pyz)$_2$, M(=NtBu)(tBuCp)(iPr,H,iPr-Pyz)$_2$, M(=NtBu)(tBuCp)(tBu,H,tBu-Pyz)$_2$, M(=NtBu)(tBuCp)(iBu,H,iBu-Pyz)$_2$, M(=NtBu)(tBuCp)(nBu,H,nBu-Pyz)$_2$, M(=NtBu)(tBuCp)(sBu,H,sBu-Pyz)$_2$, M(=NtBu)(tBuCp)(tAmyl,H,tAmyl-Pyz)$_2$, M(=NtBu)(tBuCp)(iPr,H,tBu-Pyz)$_2$, M(=NtBu)(tBuCp)(iPr,H,Me-Pyz)$_2$, M(=NtBu)(tBuCp)(iPr,H, Et-Pyz)$_2$, M(=NtBu)(tBuCp)(TMS,H, TMS-Pyz)$_2$, M(=NtBu)(tBuCp)(DMS,H,DMS-Pyz)$_2$, M(=NtBu)(tBuCp)(MMS,H,MMS-Pyz)$_2$, M(=NtAmyl)((BuCp)(H,H,H-Pyz)$_2$, M(=NtAmyl)(tBuCp)(Me,H,H-Pyz)$_2$, M(=NtAmyl)(tBuCp)(Me,H,Me-Pyz)$_2$, M(=NtAmyl)(tBuCp)(Me,Me,Me-Pyz)$_2$, M(=NtAmyl)(tBuCp)(Et,H, Et-Pyz)$_2$, M(=NtAmyl)(tBuCp)(nPr,H,nPr-Pyz)$_2$, M(=NtAmyl)(tBuCp)(iPr,H,iPr-Pyz)$_2$, M(=NtAmyl)(tBuCp)(tBu,H,tBu-Pyz)$_2$, M(=NtAmyl)(tBuCp)(iBu,H,iBu-Pyz)$_2$, M(=NtAmyl)(tBuCp)(nBu,H,nBu-Pyz)$_2$, M(=NtAmyl)(tBuCp)(sBu,H,sBu-Pyz)$_2$, M(=NtAmyl)(tBuCp)(tAmyl,H,tAmyl-Pyz)$_2$, M(=NtAmyl)(tBuCp)(iPr,H,tBu-Pyz)$_2$, M(=NtAmyl)(tBuCp)(iPr,H,Me-Pyz)$_2$, M(=NtAmyl)(tBuCp)(iPr,H, Et-Pyz)$_2$, M(=NtAmyl)(tBuCp)(TMS,H,TMS-Pyz)$_2$, M(=NtAmyl)(tBuCp)(DMS,H,DMS-Pyz)$_2$, M(=NtAmyl)(tBuCp)(MMS,H,MMS-Pyz)$_2$, M(=NMe)(tAmylCp)(H,H,H-Pyz)$_2$, M(=NMe)(tAmylCp)(Me,H,H-Pyz)$_2$, M(=NMe)(tAmylCp)(Me,H,Me-Pyz)$_2$, M(=NMe)(tAmylCp)(Me,Me,Me-Pyz)$_2$, M(=NMe)(tAmylCp)(Et,H, Et-Pyz)$_2$, M(=NMe)(tAmylCp)(nPr,H,nPr-Pyz)$_2$, M(=NMe)(tAmylCp)(iPr,H,iPr-Pyz)$_2$, M(=NMe)(tAmylCp)(tBu,H,tBu-Pyz)$_2$, M(=NMe)(tAmylCp)(iBu,H,iBu-Pyz)$_2$, M(=NMe)(tAmylCp)(nBu,H,nBu-Pyz)$_2$, M(=NMe)(tAmylCp)(sBu,H,sBu-Pyz)$_2$, M(=NMe)(tAmylCp)(tAmyl, H,tAmyl-Pyz)$_2$, M(=NMe)(tAmylCp)(iPr,H,tBu-Pyz)$_2$, M(=NMe)(tAmylCp)(iPr,H,Me-Pyz)$_2$, M(=NMe)(tAmylCp)(iPr, H, Et-Pyz)$_2$, M(=NMe)(tAmylCp)(TMS,H,TMS-Pyz)$_2$, M(=NMe)(tAmylCp)(DMS,H,DMS-Pyz)$_2$, M(=NMe)(tAmylCp)(MMS,H,MMS-Pyz)$_2$, M(=NiPr)(tAmylCp)(H,H,H-Pyz)$_2$, M(=NiPr)(tAmylCp)(Me,H,H-Pyz)$_2$, M(=NiPr)(tAmylCp)(Me,H,Me-Pyz)$_2$, M(=NiPr)(tAmylCp)(Me,Me,Me-Pyz)$_2$, M(=NiPr)(tAmylCp)(Et,H, Et-Pyz)$_2$, M(=NiPr)(tAmylCp)(nPr,H,nPr-Pyz)$_2$, M(=NiPr)(tAmylCp)(iPr,H,iPr-Pyz)$_2$, M(=NiPr)(tAmylCp)(tBu,H,tBu-Pyz)$_2$, M(=NiPr)(tAmylCp)(iBu,H,iBu-Pyz)$_2$, M(=NiPr)(tAmylCp)(nBu,H,nBu-Pyz)$_2$, M(=NiPr)(tAmylCp)(sBu,H,sBu-Pyz)$_2$, M(=NiPr)(tAmylCp)(tAmyl, H,tAmyl-Pyz)$_2$, M(=NiPr)(tAmylCp)(iPr,H,tBu-Pyz)$_2$, M(=NiPr)(tAmylCp)(iPr,H,Me-Pyz)$_2$, M(=NiPr)(tAmylCp)(iPr, H, Et-Pyz)$_2$, M(=NiPr)(tAmylCp)(TMS,H, TMS-Pyz)$_2$, M(=NiPr)(tAmylCp)(DMS,H,DMS-Pyz)$_2$, M(=NiPr)(tAmylCp)(MMS,H,MMS-Pyz)$_2$, M(=NtBu)(tAmylCp)(H,H,H-Pyz)$_2$, M(=NtBu)(tAmylCp)(Me,H,H-Pyz)$_2$, M(=NtBu)(tAmylCp)(Me,H,Me-Pyz)$_2$, M(=NtBu)(tAmylCp)(Me,Me,Me-Pyz)$_2$, M(=NtBu)(tAmylCp)(Et,H, Et-Pyz)$_2$, M(=NtBu)(tAmylCp)(nPr,H,nPr-Pyz)$_2$, M(=NtBu)(tAmylCp)(iPr,H,iPr-Pyz)$_2$, M(=NtBu)(tAmylCp)(tBu,H,tBu-Pyz)$_2$, M(=NtBu)(tAmylCp)(iBu,H,iBu-Pyz)$_2$, M(=NtBu)(tAmylCp)(nBu,H,nBu-Pyz)$_2$, M(=NtBu)(tAmylCp)(sBu,H,sBu-Pyz)$_2$, M(=NtBu)(tAmylCp)(tAmyl,H,tAmyl-Pyz)$_2$, M(=NtBu)(tAmylCp)(iPr,H,tBu-Pyz)$_2$, M(=NtBu)(tAmylCp)(iPr,H,Me-Pyz)$_2$, M(=NtBu)(tAmylCp)(iPr,H, Et-Pyz)$_2$, M(=NtBu)(tAmylCp)(TMS,H, TMS-Pyz)$_2$, M(=NtBu)(tAmylCp)(DMS,H,DMS-Pyz)$_2$, M(=NtBu)(tAmylCp)(MMS,H,MMS-Pyz)$_2$, M(=NtAmyl)(tAmylCp)(H,H,H-Pyz)$_2$, M(=NtAmyl)(tAmylCp)(Me,H,H-Pyz)$_2$, M(=NtAmyl)(tAmylCp)(Me,H,Me-Pyz)$_2$, M(=NtAmyl)(tAmylCp)(Me,Me,Me-Pyz)$_2$, M(=NtAmyl)(tAmylCp)(Et,H, Et-Pyz)$_2$, M(=NtAmyl)(tAmylCp)(nPr, H,nPr-Pyz)$_2$, M(=NtAmyl)(tAmylCp)(iPr, H,iPr-Pyz)$_2$, M(=NtAmyl)(tAmylCp)(tBu,H,tBu-Pyz)$_2$, M(=NtAmyl)(tAmylCp)(iBu,H,iBu-Pyz)$_2$, M(=NtAmyl)(tAmylCp)(nBu,H,nBu-Pyz)$_2$, M(=NtAmyl)(tAmylCp)(sBu,H,sBu-Pyz)$_2$, M(=NtAmyl)(tAmylCp)(tAmyl, H,tAmyl-Pyz)$_2$, M(=NtAmyl)(tAmylCp)(iPr,H,tBu-Pyz)$_2$, M(=NtAmyl)(tAmylCp)(iPr,H,Me-Pyz)$_2$,
M(=NtAmyl)(tAmylCp)(iPr,H, Et-Pyz)$_2$,
M(=NtAmyl)(tAmylCp)(TMS,H,TMS-Pyz)$_2$,
M(=NtAmyl)(tAmylCp)(DMS,H,DMS-Pyz)$_2$, and
M(=NtAmyl)(tAmylCp)(MMS,H,MMS-Pyz)$_2$,
where M is Nb, Ta or V.

Notation and Nomenclature

The following detailed description and claims utilize a number of abbreviations, symbols, and terms, which are generally well known in the art.

As used herein, the indefinite article "a" or "an" means one or more.

As used herein, "about" or "around" or "approximately" in the text or in a claim means ±10% of the value stated.

Any and all ranges recited herein are inclusive of their endpoints (i.e., x=1 to 4 or x ranges from 1 to 4 includes x=1, x=4, and x=any number in between), irrespective of whether the term "inclusively" is used.

The standard abbreviations of the elements from the periodic table of elements are used herein. It should be understood that elements may be referred to by these abbreviations (e.g., Nb refers to Niobium, N refers to nitrogen, C refers to carbon, etc.).

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used herein, the term "alkyl group" refers to saturated functional groups containing exclusively carbon and hydrogen atoms. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "Pr" refers to a propyl group; the abbreviation "nPr" refers to a "normal" or linear propyl group; the abbreviation "iPt" refers to an isopropyl group; the abbreviation "Bu" refers to a butyl group; the abbreviation "nBu" refers to a "normal" or linear butyl group; the abbreviation "tBu" refers to a tert-butyl group, also known as 1,1-dimethylethyl; the abbreviation "sBu" refers to a sec-butyl group, also known as 1-methylpropyl; the abbreviation "iBu" refers to an iso-butyl group, also known as 2-methylpropyl; the abbreviation "amyl" refers to an amyl or pentyl group; the abbreviation "tAmyl" refers to a tert-amyl group, also known as 1,1-dimethylpropyl.

As used herein, the abbreviation "TMS" refers to trimethylsilyl (Me$_3$Si—); the abbreviation "DMS" refers to dimethylsilyl (Me$_2$HSi—); the abbreviation "MMS" refers to monomethylsilyl (MeH$_2$Si—); the abbreviation "py" refers to pyridine; and the abbreviation $R^1$, $R^2$, $R^3$-Pyr refers to a pyrazolyl ligand having the following structure:

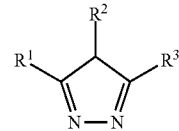

Please note that the films or layers deposited, such as niobium oxide or niobium nitride, may be listed throughout the specification and claims without reference to their proper stoichiometry (e.g., NbO=Nb$_2$O$_5$). These layers may also contain Hydrogen, typically from 0 atomic % to 15 atomic %. However, since not routinely measured, any film compositions given ignore their H content, unless explicitly stated otherwise.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DESCRIPTION OF PREFERRED EMBODIMENTS

Figure 1:
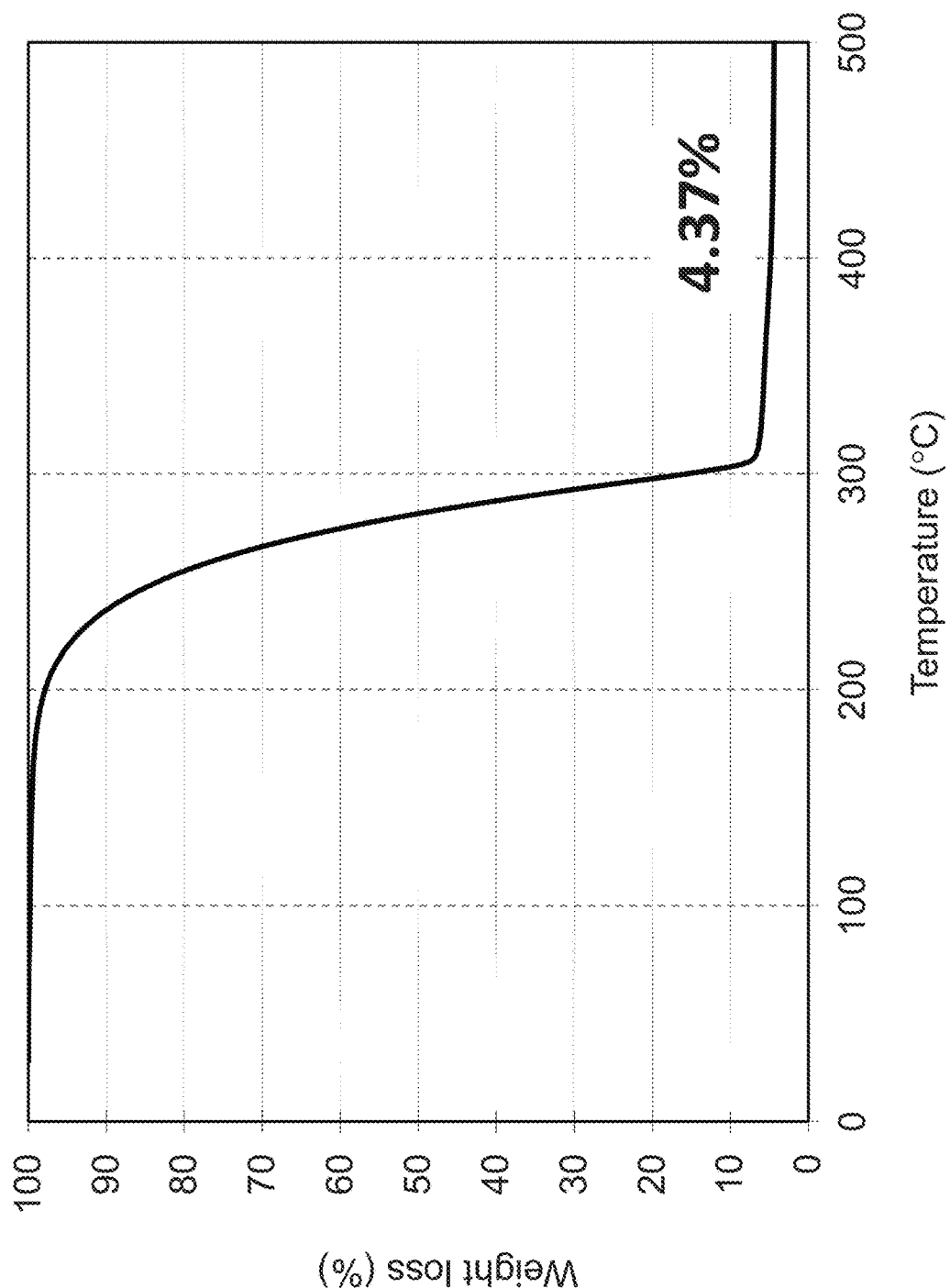
FIG. 1 is a thermogravimetric analysis (TGA) curve of Nb(=NtBu)(MeCp)(Me,H,Me-pyz)$_2$.

Disclosed are Group V (five) element-containing film forming compositions comprising precursors having the formula:

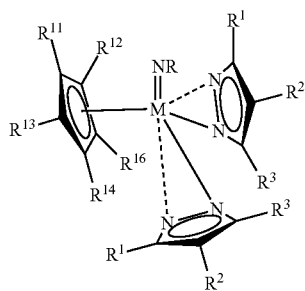

wherein M is Group V (five) element, vanadium (V), niobium (Nb), or tantalum (Ta); R is H, Me, Et, nPr, iPr, nBu, sBu, tert-Bu, n-pentyl, i-pentyl, neo-pentyl, or tert-amyl;

each $R^1$, $R^2$, and $R^3$ is independently H, an alkyl group, or a SiR's group, with each R' independently being H or an alkyl group; each $R^{11}$, $R^{12}$, $R^{13}$, $R^{14}$, $R^{15}$ is independently H, Me, Et, nPr, iPr, nBu, sBu, iBu, or tBu. Preferably, each $R^1$, $R^2$, $R^3$ is independently H, Me, Et, nPr, iPr, tBu, sBu, iBu, nBu, tAmyl, SiMes, $SiMe_2H$, or $SiH_2Me$. As illustrated in the above formula, the nitrogen atoms may be bonded to the center Group V (five) atom M, resulting in a tetracoordinate M(V) center. The resulting geometry may be pseudo tetrahedral where the center of the nitrogen-nitrogen bond in each 3,5-dialkylpyrazolate moiety is considered as a monodentate ligand. The carbon atoms in the pyrazolyl ligand may be sp2 hybridized, resulting in a delocalized charge across the monoanionic ligand where M may be considered to be coordinated by two nitrogen atoms in the pyrazolate ring.

Exemplary precursors containing the Group V (five) element M include: M(=NMe)Cp(H,H,H-Pyz)$_2$, M(=NMe)Cp(Me,H,H-Pyz)$_2$, M(=NMe)Cp(Me,H,Me-Pyz)$_2$, M(=NMe)Cp(Me,Me,Me-Pyz)$_2$, M(=NMe)Cp(Et,H, Et-Pyz)$_2$, M(=NMe)Cp(nPr,H,nPr-Pyz)$_2$, M(=NMe)Cp(iPr,H,iPr-Pyz)$_2$, M(=NMe)Cp(tBu,H,tBu-Pyz)$_2$, M(=NMe)Cp(iBu,H,iBu-Pyz)$_2$, M(=NMe)Cp(nBu,H,nBu-Pyz)$_2$, M(=NMe)Cp(sBu,H,sBu-Pyz)$_2$, M(=NMe)Cp(tAmyl,H,tAmyl-Pyz)$_2$, M(=NMe)Cp(iPr,H,tBu-Pyz)$_2$, M(=NMe)Cp(iPr,H,Me-Pyz)$_2$, M(=NMe)Cp(iPr,H, Et-Pyz)$_2$, M(=NMe)Cp(TMS,H,TMS-Pyz)$_2$, M(=NMe)Cp(DMS,H,DMS-Pyz)$_2$, M(=NMe)Cp(MMS,H,MMS-Pyz)$_2$, M(=NiPr)Cp(H,H,H-Pyz)$_2$, M(=NiPr)Cp(Me,H,H-Pyz)$_2$, M(=NiPr)Cp(Me,H,Me-Pyz)$_2$, M(=NiPr)Cp(Me,Me,Me-Pyz)$_2$, M(=NiPr)Cp(Et,H, Et-Pyz)$_2$, M(=NiPr)Cp(nPr,H,nPr-Pyz)$_2$, M(=NiPr)Cp(iPr,H,iPr-Pyz)$_2$, M(=NiPr)Cp(tBu,H,tBu-Pyz)$_2$, M(=NiPr)Cp(iBu,H,iBu-Pyz)$_2$, M(=NiPr)Cp(nBu,H,nBu-Pyz)$_2$, M(=NiPr)Cp(sBu,H,sBu-Pyz)$_2$, M(=NiPr)Cp(tAmyl,H,tAmyl-Pyz)$_2$, M(=NiPr)Cp(iPr,H,tBu-Pyz)$_2$, M(=NiPr)Cp(iPr,H,Me-Pyz)$_2$, M(=NiPr)Cp(iPr,H, Et-Pyz)$_2$, M(=NiPr)Cp(TMS,H,TMS-Pyz)$_2$, M(=NiPr)Cp(DMS,H,DMS-Pyz)$_2$, M(=NiPr)Cp(MMS,H,MMS-Pyz)$_2$, M(=NtBu)Cp(H,H,H-Pyz)$_2$, M(=NtBu)Cp(Me,H,H-Pyz)$_2$, M(=NtBu)Cp(Me,H,Me-Pyz)$_2$, M(=NtBu)Cp(Me,Me,Me-Pyz)$_2$, M(=NtBu)Cp(Et,H, Et-Pyz)$_2$, M(=NtBu)Cp(nPr,H,nPr-Pyz)$_2$, M(=NtBu)Cp(iPr,H,iPr-Pyz)$_2$, M(=NtBu)Cp(tBu,H,tBu-Pyz)$_2$, M(=NtBu)Cp(iBu,H,iBu-Pyz)$_2$, M(=NtBu)Cp(nBu,H,nBu-Pyz)$_2$, M(=NtBu)Cp(sBu,H,sBu-Pyz)$_2$, M(=NtBu)Cp(tAmyl,H,tAmyl-Pyz)$_2$, M(=NtBu)Cp(iPr,H,tBu-Pyz)$_2$, M(=NtBu)Cp(iPr,H,Me-Pyz)$_2$, M(=NtBu)Cp(iPr,H, Et-Pyz)$_2$, M(=NtBu)Cp(TMS,H,TMS-Pyz)$_2$, M(=NtBu)Cp(DMS,H,DMS-Pyz)$_2$, M(=NtBu)Cp(MMS,H,MMS-Pyz)$_2$, M(=NtAmyl)Cp(H,H,H-Pyz)$_2$, M(=NtAmyl)Cp(Me,H,H-Pyz)$_2$, M(=NtAmyl)Cp(Me,H,Me-Pyz)$_2$, M(=NtAmyl)Cp(Me,Me,Me-Pyz)$_2$, M(=NtAmyl)Cp(Et,H, Et-Pyz)$_2$, M(=NtAmyl)Cp(nPr,H,nPr-Pyz)$_2$, M(=NtAmyl)Cp(iPr,H,iPr-Pyz)$_2$, M(=NtAmyl)Cp(tBu,H,tBu-Pyz)$_2$, M(=NtAmyl)Cp(iBu,H,iBu-Pyz)$_2$, M(=NtAmyl)Cp(nBu,H,nBu-Pyz)$_2$, M(=NtAmyl)Cp(sBu,H,sBu-Pyz)$_2$, M(=NtAmyl)Cp(tAmyl,H,tAmyl-Pyz)$_2$, M(=NtAmyl)Cp(iPr,H,tBu-Pyz)$_2$, M(=NtAmyl)Cp(iPr,H,Me-Pyz)$_2$, M(=NtAmyl)Cp(iPr,H, Et-Pyz)$_2$, M(=NtAmyl)Cp(TMS,H,TMS-Pyz)$_2$, M(=NtAmyl)Cp(DMS,H,DMS-Pyz)$_2$, M(=NtAmyl)Cp(MMS,H,MMS-Pyz)$_2$, M(=NMe)(MeCp)(H,H,H-Pyz)$_2$, M(=NMe)(MeCp)(Me,H,H-Pyz)$_2$, M(=NMe)(MeCp)(Me,H,Me-Pyz)$_2$, M(=NMe)(MeCp)(Me,Me,Me-Pyz)$_2$, M(=NMe)(MeCp)(Et,H, Et-Pyz)$_2$, M(=NMe)(MeCp)(nPr,H,nPr-Pyz)$_2$, M(=NMe)(MeCp)(iPr,H,iPr-Pyz)$_2$, M(=NMe)(MeCp)(tBu,H,tBu-Pyz)$_2$, M(=NMe)(MeCp)(iBu,H,iBu-Pyz)$_2$, M(=NMe)(MeCp)(nBu,H,nBu-Pyz)$_2$, M(=NMe)(MeCp)(sBu,H,sBu-Pyz)$_2$, M(=NMe)(MeCp)(tAmyl,H,tAmyl-Pyz)$_2$, M(=NMe)(MeCp)(iPr,H,tBu-Pyz)$_2$, M(=NMe)(MeCp)(iPr,H,Me-Pyz)$_2$, M(=NMe)(MeCp)(iPr,H, Et-Pyz)$_2$, M(=NMe)(MeCp)(TMS,H,TMS-Pyz)$_2$, M(=NMe)(MeCp)(DMS,H,DMS-Pyz)$_2$, M(=NMe)(MeCp)(MMS,H,MMS-Pyz)$_2$, M(=NiPr)(MeCp)(H,H,H-Pyz)$_2$, M(=NiPr)(MeCp)(Me,H,H-Pyz)$_2$, M(=NiPr)(MeCp)(Me,H,Me-Pyz)$_2$, M(=NiPr)(MeCp)(Me,Me,Me-Pyz)$_2$, M(=NiPr)(MeCp)(Et,H, Et-Pyz)$_2$, M(=NiPr)(MeCp)(nPr,H,nPr-Pyz)$_2$, M(=NiPr)(MeCp)(iPr,H,iPr-Pyz)$_2$, M(=NiPr)(MeCp)(tBu,H,tBu-Pyz)$_2$, M(=NiPr)(MeCp)(iBu,H,iBu-Pyz)$_2$, M(=NiPr)(MeCp)(nBu,H,nBu-Pyz)$_2$, M(=NiPr)(MeCp)(sBu,H,sBu-Pyz)$_2$, M(=NiPr)(MeCp)(tAmyl,H,tAmyl-Pyz)$_2$, M(=NiPr)(MeCp)(iPr,H,tBu-Pyz)$_2$, M(=NiPr)(MeCp)(iPr,H,Me-Pyz)$_2$, M(=NiPr)(MeCp)(iPr,H, Et-Pyz)$_2$, M(=NiPr)(MeCp)(TMS,H,TMS-Pyz)$_2$, M(=NiPr)(MeCp)(DMS,H,DMS-Pyz)$_2$, M(=NiPr)(MeCp)(MMS,H,MMS-Pyz)$_2$, M(=NtBu)(MeCp)(H,H,H-Pyz)$_2$, M(=NtBu)(MeCp)(Me,H,H-Pyz)$_2$, M(=NtBu)(MeCp)(Me,H,Me-Pyz)$_2$, M(=NtBu)(MeCp)(Me,Me,Me-Pyz)$_2$, M(=NtBu)(MeCp)(Et,H, Et-Pyz)$_2$, M(=NtBu)(MeCp)(nPr,H,nPr-Pyz)$_2$, M(=NtBu)(MeCp)(iPr,H,iPr-Pyz)$_2$, M(=NtBu)(MeCp)(tBu,H,tBu-Pyz)$_2$, M(=NtBu)(MeCp)(iBu,H,iBu-Pyz)$_2$, M(=NtBu)(MeCp)(nBu,H,nBu-Pyz)$_2$, M(=NtBu)(MeCp)(sBu,H,sBu-Pyz)$_2$, M(=NtBu)(MeCp)(tAmyl,H,tAmyl-Pyz)$_2$, M(=NtBu)(MeCp)(iPr,H,tBu-Pyz)$_2$, M(=NtBu)(MeCp)(iPr,H,Me-Pyz)$_2$, M(=NtBu)(MeCp)(iPr,H, Et-Pyz)$_2$, M(=NtBu)(MeCp)(TMS,H,TMS-Pyz)$_2$, M(=NtBu)(MeCp)(DMS,H,DMS-Pyz)$_2$, M(=NtBu)(MeCp)(MMS,H,MMS-Pyz)$_2$, M(=NtAmyl)(MeCp)(H,H,H-Pyz)$_2$, M(=NtAmyl)(MeCp)(Me,H,H-Pyz)$_2$, M(=NtAmyl)(MeCp)(Me,H,Me-Pyz)$_2$, M(=NtAmyl)(MeCp)(Me,Me,Me-Pyz)$_2$, M(=NtAmyl)(MeCp)(Et,H, Et-Pyz)$_2$, M(=NtAmyl)(MeCp)(nPr,H,nPr-Pyz)$_2$, M(=NtAmyl)(MeCp)(iPr,H,iPr-Pyz)$_2$, M(=NtAmyl)(MeCp)(tBu,H,tBu-Pyz)$_2$, M(=NtAmyl)(MeCp)(iBu,H,iBu-Pyz)$_2$, M(=NtAmyl)(MeCp)(nBu,H,nBu-Pyz)$_2$, M(=NtAmyl)(MeCp)(sBu,H,sBu-Pyz)$_2$, M(=NtAmyl)(MeCp)(tAmyl,H,tAmyl-Pyz)$_2$, M(=NtAmyl)(MeCp)(iPr,H,tBu-Pyz)$_2$, M(=NtAmyl)(MeCp)(iPr,H,Me-Pyz)$_2$, M(=NtAmyl)(MeCp)(iPr,H, Et-Pyz)$_2$, M(=NtAmyl)(MeCp)(TMS,H,TMS-Pyz)$_2$, M(=NtAmyl)(MeCp)(DMS,H,DMS-Pyz)$_2$, M(=NtAmyl)(MeCp)(MMS,H,MMS-Pyz)$_2$, M(=NMe)(iPrCp)(H,H,H-Pyz)$_2$, M(=NMe)(iPrCp)(Me,H,H-Pyz)$_2$, M(=NMe)(iPrCp)(Me,H,Me-Pyz)$_2$, M(=NMe)(iPrCp)(Me,Me,Me-Pyz)$_2$, M(=NMe)(iPrCp)(Et,H, Et-Pyz)$_2$, M(=NMe)(iPrCp)(nPr,H,nPr-Pyz)$_2$, M(=NMe)(iPrCp)(iPr,H,iPr-Pyz)$_2$, M(=NMe)(iPrCp)(tBu,H,tBu-Pyz)$_2$, M(=NMe)(iPrCp)(iBu,H,iBu-Pyz)$_2$, M(=NMe)(iPrCp)(nBu,H,nBu-Pyz)$_2$, M(=NMe)(iPrCp)(sBu,H,sBu-Pyz)$_2$, M(=NMe)(iPrCp)(tAmyl,H,tAmyl-Pyz)$_2$, M(=NMe)(iPrCp)(iPr,H,tBu-Pyz)$_2$, M(=NMe)(iPrCp)(iPr,H,Me-Pyz)$_2$, M(=NMe)(iPrCp)(iPr,H, Et-Pyz)$_2$, M(=NMe)(iPrCp)(TMS,H,TMS-Pyz)$_2$, M(=NMe)(iPrCp)(DMS,H,DMS-Pyz)$_2$, M(=NMe)(iPrCp)(MMS,H,MMS-Pyz)$_2$, M(=NiPr)(iPrCp)(H,H,H-Pyz)$_2$, M(=NiPr)(iPrCp)(Me,H,H-Pyz)$_2$, M(=NiPr)(iPrCp)(Me,H,Me-Pyz)$_2$, M(=NiPr)(iPrCp)(Me,Me,Me-Pyz)$_2$, M(=NiPr)(iPrCp)(Et,H, Et-Pyz)$_2$, M(=NiPr)(iPrCp)(nPr,H,nPr-Pyz)$_2$, M(=NiPr)(iPrCp)(iPr,H,iPr-Pyz)$_2$, M(=NiPr)(iPrCp)(tBu,H,tBu-Pyz)$_2$, M(=NiPr)(iPrCp)(iBu,H,iBu-Pyz)$_2$, M(=NiPr)(iPrCp)(nBu,H,nBu-Pyz)$_2$, M(=NiPr)(iPrCp)(sBu,H,sBu-Pyz)$_2$, M(=NiPr)(iPrCp)(tAmyl,H,tAmyl-Pyz)$_2$, M(=NiPr)(iPrCp)(iPr,H,tBu-Pyz)$_2$, M(=NiPr)(iPrCp)(iPr,H,Me-Pyz)$_2$, M(=NiPr)(iPrCp)(iPr,H, Et-Pyz)$_2$, M(=NiPr)(iPrCp)(TMS,H, TMS-Pyz)$_2$, M(=NiPr)(iPrCp)(DMS,H,DMS-Pyz)$_2$, M(=NiPr)(iPrCp)(MMS,H,MMS-Pyz)$_2$, M(=NtBu)(iPrCp)(H,H,H-Pyz)$_2$, M(=NtBu)(iPrCp)(Me,H,H-Pyz)$_2$, M(=NtBu)(iPrCp)(Me,H,Me-Pyz)$_2$, M(=NtBu)(iPrCp)(Me,Me,Me-Pyz)$_2$, M(=NtBu)(iPrCp)(Et,H, Et-Pyz)$_2$, M(=NtBu)(iPrCp)(nPr,H,nPr-Pyz)$_2$, M(=NtBu)(iPrCp)(iPr,H,iPr-Pyz)$_2$, M(=NtBu)(iPrCp)(tBu,H,tBu-Pyz)$_2$, M(=NtBu)(iPrCp)(iBu,H,iBu-Pyz)$_2$, M(=NtBu)(iPrCp)(nBu,H,nBu-Pyz)$_2$, M(=NtBu)(iPrCp)(sBu,H,sBu-Pyz)$_2$, M(=NtBu)(iPrCp)(tAmyl,H,tAmyl-Pyz)$_2$, M(=NtBu)(iPrCp)(iPr,H,tBu-Pyz)$_2$, M(=NtBu)(iPrCp)(iPr,H,Me-Pyz)$_2$, M(=NtBu)(iPrCp)(iPr,H, Et-Pyz)$_2$, M(=NtBu)(iPrCp)(TMS,H,TMS-Pyz)$_2$, M(=NtBu)(iPrCp)(DMS,H,DMS-Pyz)$_2$, M(=NtBu)(iPrCp)(MMS,H,MMS-Pyz)$_2$, M(=NtAmyl)(iPrCp)(H,H,H-Pyz)$_2$, M(=NtAmyl)(iPrCp)(Me,H,H-Pyz)$_2$, M(=NtAmyl)(iPrCp)(Me,H,Me-Pyz)$_2$, M(=NtAmyl)(iPrCp)(Me,Me,Me-Pyz)$_2$, M(=NtAmyl)(iPrCp)(Et,H, Et-Pyz)$_2$, M(=NtAmyl)(iPrCp)(nPr,H,nPr-Pyz)$_2$, M(=NtAmyl)(iPrCp)(iPr,H,iPr-Pyz)$_2$, M(=NtAmyl)(iPrCp)(tBu,H,tBu-Pyz)$_2$, M(=NtAmyl)(iPrCp)(iBu,H,iBu-Pyz)$_2$, M(=NtAmyl)(iPrCp)(nBu,H,nBu-Pyz)$_2$, M(=NtAmyl)(iPrCp)(sBu,H,sBu-Pyz)$_2$, M(=NtAmyl)(iPrCp)(tAmyl,H,tAmyl-Pyz)$_2$, M(=NtAmyl)(iPrCp)(iPr,H,tBu-Pyz)$_2$, M(=NtAmyl)(iPrCp)(iPr,H,Me-Pyz)$_2$, M(=NtAmyl)(iPrCp)(iPr,H, Et-Pyz)$_2$, M(=NtAmyl)(iPrCp)(TMS,H,TMS-Pyz)$_2$, M(=NtAmyl)(iPrCp)(DMS,H,DMS-Pyz)$_2$, M(=NtAmyl)(iPrCp)(MMS,H,MMS-Pyz)$_2$, M(=NMe)(tBuCp)(H,H,H-Pyz)$_2$, M(=NMe)(tBuCp)(Me,H,H-Pyz)$_2$, M(=NMe)(tBuCp)(Me,H,Me-Pyz)$_2$, M(=NMe)(tBuCp)(Me,Me,Me-Pyz)$_2$, M(=NMe)(tBuCp)(Et,H, Et-Pyz)$_2$, M(=NMe)(tBuCp)(nPr,H,nPr-Pyz)$_2$, M(=NMe)(tBuCp)(iPr,H,iPr-Pyz)$_2$, M(=NMe)(tBuCp)(tBu,H,tBu-Pyz)$_2$, M(=NMe)(tBuCp)(iBu,H,iBu-Pyz)$_2$, M(=NMe)(tBuCp)(nBu,H,nBu-Pyz)$_2$, M(=NMe)(tBuCp)(sBu,H,sBu-Pyz)$_2$, M(=NMe)(tBuCp)(tAmyl,H,tAmyl-Pyz)$_2$, M(=NMe)(tBuCp)(iPr,H,tBu-Pyz)$_2$, M(=NMe)(tBuCp)(iPr,H,Me-Pyz)$_2$, M(=NMe)(tBuCp)(iPr,H, Et-Pyz)$_2$, M(=NMe)(tBuCp)(TMS,H,TMS-Pyz)$_2$, M(=NMe)(tBuCp)(DMS,H,DMS-Pyz)$_2$, M(=NMe)(tBuCp)(MMS,H,MMS-Pyz)$_2$, M(=NiPr)((BuCp)(H,H,H-Pyz)$_2$, M(=NiPr)(tBuCp)(Me,H,H-Pyz)$_2$, M(=NiPr)(tBuCp)(Me,H,Me-Pyz)$_2$, M(=NiPr)(tBuCp)(Me,Me,Me-Pyz)$_2$, M(=NiPr)(tBuCp)(Et,H, Et-Pyz)$_2$, M(=NiPr)(tBuCp)(nPr,H,nPr-Pyz)$_2$, M(=NiPr)(tBuCp)(iPr,H,iPr-Pyz)$_2$, M(=NiPr)(tBuCp)(tBu,H,tBu-Pyz)$_2$, M(=NiPr)(tBuCp)(iBu,H,iBu-Pyz)$_2$, M(=NiPr)(tBuCp)(nBu,H,nBu-Pyz)$_2$, M(=NiPr)(tBuCp)(sBu,H,sBu-Pyz)$_2$, M(=NiPr)(tBuCp)(tAmyl,H,tAmyl-Pyz)$_2$, M(=NiPr)(tBuCp)(iPr,H,tBu-Pyz)$_2$, M(=NiPr)(tBuCp)(iPr,H,Me-Pyz)$_2$, M(=NiPr)(tBuCp)(iPr,H, Et-Pyz)$_2$, M(=NiPr)(tBuCp)(TMS,H,TMS-Pyz)$_2$, M(=NiPr)(tBuCp)(DMS,H,DMS-Pyz)$_2$, M(=NiPr)(tBuCp)(MMS,H,MMS-Pyz)$_2$, M(=NtBu)((BuCp)(H,H,H-Pyz)$_2$, M(=NtBu)(tBuCp)(Me,H,H-Pyz)$_2$, M(=NtBu)(tBuCp)(Me,H,Me-Pyz)$_2$, M(=NtBu)(tBuCp)(Me,Me,Me-Pyz)$_2$, M(=NtBu)(tBuCp)(Et,H, Et-Pyz)$_2$, M(=NtBu)(tBuCp)(nPr,H,nPr-Pyz)$_2$, M(=NtBu)(tBuCp)(iPr,H,iPr-Pyz)$_2$, M(=NtBu)(tBuCp)(tBu,H,tBu-Pyz)$_2$, M(=NtBu)(tBuCp)(iBu,H,iBu-Pyz)$_2$, M(=NtBu)(tBuCp)(nBu,H,nBu-Pyz)$_2$, M(=NtBu)(tBuCp)(sBu,H,sBu-Pyz)$_2$, M(=NtBu)(tBuCp)(tAmyl,H,tAmyl-Pyz)$_2$, M(=NtBu)(tBuCp)(iPr,H,tBu-Pyz)$_2$, M(=NtBu)(tBuCp)(iPr,H,Me-Pyz)$_2$, M(=NtBu)(tBuCp)(iPr,H, Et-Pyz)$_2$, M(=NtBu)(tBuCp)(TMS,H,TMS-Pyz)$_2$, M(=NtBu)(tBuCp)(DMS,H,DMS-Pyz)$_2$, M(=NtBu)(tBuCp)(MMS,H,MMS-Pyz)$_2$, M(=NtAmyl)(tBuCp)(H,H,H-Pyz)$_2$, M(=NtAmyl)(tBuCp)(Me,H,H-Pyz)$_2$, M(=NtAmyl)(tBuCp)(Me,H,Me-Pyz)$_2$, M(=NtAmyl)(tBuCp)(Me,Me,Me-Pyz)$_2$, M(=NtAmyl)(tBuCp)(Et,H, Et-Pyz)$_2$, M(=NtAmyl)(tBuCp)(nPr,H,nPr-Pyz)$_2$, M(=NtAmyl)(tBuCp)(iPr,H,iPr-Pyz)$_2$, M(=NtAmyl)(tBuCp)(tBu,H,tBu-Pyz)$_2$, M(=NtAmyl)(tBuCp)(iBu,H,iBu-Pyz)$_2$, M(=NtAmyl)(tBuCp)(nBu,H,nBu-Pyz)$_2$, M(=NtAmyl)(tBuCp)(sBu,H,sBu-Pyz)$_2$, M(=NtAmyl)(tBuCp)(tAmyl,H,tAmyl-Pyz)$_2$, M(=NtAmyl)(tBuCp)(iPr,H,tBu-Pyz)$_2$, M(=NtAmyl)(tBuCp)(iPr,H,Me-Pyz)$_2$, M(=NtAmyl)(tBuCp)(iPr,H, Et-Pyz)$_2$, M(=NtAmyl)(tBuCp)(TMS,H, TMS-Pyz)$_2$, M(=NtAmyl)(tBuCp)(DMS,H,DMS-Pyz)$_2$, M(=NtAmyl)(tBuCp)(MMS,H,MMS-Pyz)$_2$, M(=NMe)(tAmylCp)(H,H,H-Pyz)$_2$, M(=NMe)(tAmylCp)(Me,H,H-Pyz)$_2$, M(=NMe)(tAmylCp)(Me,H,Me-Pyz)$_2$, M(=NMe)(tAmylCp)(Me,Me,Me-Pyz)$_2$, M(=NMe)(tAmylCp)(Et,H, Et-Pyz)$_2$, M(=NMe)(tAmylCp)(nPr,H,nPr-Pyz)$_2$, M(=NMe)(tAmylCp)(iPr,H,iPr-Pyz)$_2$, M(=NMe)(tAmylCp)(tBu,H,tBu-Pyz)$_2$, M(=NMe)(tAmylCp)(iBu,H,iBu-Pyz)$_2$, M(=NMe)(tAmylCp)(nBu,H,nBu-Pyz)$_2$, M(=NMe)(tAmylCp)(sBu,H,sBu-Pyz)$_2$, M(=NMe)(tAmylCp)(tAmyl,H,tAmyl-Pyz)$_2$, M(=NMe)(tAmylCp)(iPr,H,tBu-Pyz)$_2$, M(=NMe)(tAmylCp)(iPr,H,Me-Pyz)$_2$, M(=NMe)(tAmylCp)(iPr,H, Et-Pyz)$_2$, M(=NMe)(tAmylCp)(TMS,H, TMS-Pyz)$_2$, M(=NMe)(tAmylCp)(DMS,H,DMS-Pyz)$_2$, M(=NMe)(tAmylCp)(MMS,H,MMS-Pyz)$_2$, M(=NiPr)(tAmylCp)(H,H,H-Pyz)$_2$, M(=NiPr)(tAmylCp)(Me,H,H-Pyz)$_2$, M(=NiPr)(tAmylCp)(Me,H,Me-Pyz)$_2$, M(=NiPr)(tAmylCp)(Me,Me,Me-Pyz)$_2$, M(=NiPr)(tAmylCp)(Et,H, Et-Pyz)$_2$, M(=NiPr)(tAmylCp)(nPr,H,nPr-Pyz)$_2$, M(=NiPr)(tAmylCp)(iPr,H,iPr-Pyz)$_2$, M(=NiPr)(tAmylCp)(tBu,H,tBu-Pyz)$_2$, M(=NiPr)(tAmylCp)(iBu,H,iBu-Pyz)$_2$, M(=NiPr)(tAmylCp)(nBu,H,nBu-Pyz)$_2$, M(=NiPr)(tAmylCp)(sBu,H,sBu-Pyz)$_2$, M(=NiPr)(tAmylCp)(tAmyl,H,tAmyl-Pyz)$_2$, M(=NiPr)(tAmylCp)(iPr,H,tBu-Pyz)$_2$, M(=NiPr)(tAmylCp)(iPr,H,Me-Pyz)$_2$, M(=NiPr)(tAmylCp)(iPr,H, Et-Pyz)$_2$, M(=NiPr)(tAmylCp)(TMS,H, TMS-Pyz)$_2$, M(=NiPr)(tAmylCp)(DMS,H,DMS-Pyz)$_2$, M(=NiPr)(tAmylCp)(MMS,H,MMS-Pyz)$_2$, M(=NtBu)(tAmylCp)(H,H,H-Pyz)$_2$, M(=NtBu)(tAmylCp)(Me, H,H-Pyz)$_2$, M(=NtBu)(tAmylCp)(Me,H,Me-Pyz)$_2$, M(=NtBu)(tAmylCp)(Me,Me,Me-Pyz)$_2$, M(=NtBu)(tAmylCp)(Et,H, Et-Pyz)$_2$, M(=NtBu)(tAmylCp)(nPr,H,nPr-Pyz)$_2$, M(=NtBu)(tAmylCp)(iPr,H,iPr-Pyz)$_2$, M(=NtBu)(tAmylCp)(tBu,H,tBu-Pyz)$_2$, M(=NtBu)(tAmylCp)(iBu,H,iBu-Pyz)$_2$, M(=NtBu)(tAmylCp)(nBu,H,nBu-Pyz)$_2$, M(=NtBu)(tAmylCp)(sBu,H,sBu-Pyz)$_2$, M(=NtBu)(tAmylCp)(tAmyl,H,tAmyl-Pyz)$_2$, M(=NtBu)(tAmylCp)(iPr,H,tBu-Pyz)$_2$, M(=NtBu)(tAmylCp)(iPr,H,Me-Pyz)$_2$, M(=NtBu)(tAmylCp)(iPr,H, Et-Pyz)$_2$, M(=NtBu)(tAmylCp)(TMS,H,TMS-Pyz)$_2$, M(=NtBu)(tAmylCp)(DMS,H,DMS-Pyz)$_2$, M(=NtBu)(tAmylCp)(MMS,H,MMS-Pyz)$_2$, M(=NtAmyl)(tAmylCp)(H,H,H-Pyz)$_2$, M(=NtAmyl)(tAmylCp)(Me,H,H-Pyz)$_2$, M(=NtAmyl)(tAmylCp)(Me,H,Me-Pyz)$_2$, M(=NtAmyl)(tAmylCp)(Me,Me,Me-Pyz)$_2$, M(=NtAmyl)(tAmylCp)(Et, H, Et-Pyz)$_2$, M(=NtAmyl)(tAmylCp)(nPr,H,nPr-Pyz)$_2$, M(=NtAmyl)(tAmylCp)(iPr,H,iPr-Pyz)$_2$, M(=NtAmyl)(tAmylCp)(tBu,H,tBu-Pyz)$_2$, M(=NtAmyl)(tAmylCp)(iBu,H,iBu-Pyz)$_2$, M(=NtAmyl)(tAmylCp)(nBu,H,nBu-Pyz)$_2$, M(=NtAmyl)(tAmylCp)(sBu,H,sBu-Pyz)$_2$, M(=NtAmyl)(tAmylCp)(tAmyl,H,tAmyl-Pyz)$_2$, M(=NtAmyl)(tAmylCp)(iPr,H,tBu-Pyz)$_2$, M(=NtAmyl)(tAmylCp)(iPr,H,Me-Pyz)$_2$, M(=NtAmyl)(tAmylCp)(iPr,H, Et-Pyz)$_2$, M(=NtAmyl)(tAmylCp)(TMS,H,TMS-Pyz)$_2$, M(=NtAmyl)(tAmylCp)(DMS,H,DMS-Pyz)$_2$ and M(=NtAmyl)(tAmylCp)(MMS,H,MMS-Pyz)$_2$, wherein M is V, Nb or Ta.

More preferably, the disclosed precursor is Nb(=NtBu)(MeCp)(Me,H,Me-pyz)$_2$, or Nb(=NtBu)(MeCp)(iPr,H,iPr-pyz)$_2$. These precursors may be synthesized by reacting Nb(═NtBu)(MeCp)(NEt2)$_2$ with 2 equivalents of (R,H,R-pyz) H (R=Me, iPr) in toluene.

The disclosed precursors have the flowing advantages. The disclosed precursors have high thermal stability, so that a high deposition temperature and a broad ALD window are expected. In addition, the disclosed precursors are liquid precursors and therefore easier for vaporization and vapor delivery.

Purity of the disclosed Group V (five) element-containing film forming composition is greater than 95% w/w (i.e., 95,0% w/w to 100,0% w/w), preferably greater than 98% w/w (i.e., 98,0% w/w to 100,0% w/w), and more preferably greater than 99% w/w (i.e., 99,0% w/w to 100,0% w/w). One of ordinary skill in the art will recognize that the purity may be determined by H NMR and gas liquid chromatography with mass spectrometry. The disclosed Group V (five) element-containing film forming compositions may contain any of the following impurities: pyrazoles; pyridines; alkylamines; alkylimines; THF; ether; pentane; cyclohexane; heptanes; benzene; toluene; chlorinated metal compounds; lithium, sodium, potassium pyrazolyl. The total quantity of these impurities is preferably below 5% w/w (i.e., 0.0% w/w to 5,0% w/w), preferably below 2% w/w (i.e., 0.0% w/w to 2,0% w/w), and more preferably below 1% w/w (i.e., 0.0% w/w to 1,0% w/w). The composition may be purified by recrystallisation, sublimation, distillation, and/or passing the gas liquid through a suitable adsorbent, such as a 4 Å molecular sieve.

Purification of the disclosed Group V (five) element-containing film forming composition may also result in metal impurities at the 0 ppbw to 1 ppmw, preferably 0-500 ppbw (part per billion weight) level. These metal impurities may include, but are not limited to, Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Gallium (Ga), Germanium (Ge), Hafnium (Hf), Zirconium (Zr), Indium (In), Iron (Fe), Lead (Pb), Lithium (Li), Magnesium (Mg), Manganese (Mn), Tungsten (W), Nickel (Ni), Potassium (K), Sodium (Na), Strontium (Sr), Thorium (Th), Tin (Sn), Titanium (Ti), Uranium (U), and Zinc (Zn).

Also disclosed are methods for forming Group V (five) element-containing layers on a substrate using a vapor deposition process. Applicants believe, and demonstrate in the Deposition Example that follows, that the disclosed Group V (five) element-containing film forming compositions are suitable for atomic layer deposition (ALD). More particularly, the disclosed Group V (five) element-containing film forming compositions are capable of surface saturation, self-limited growth per cycle, and perfect step coverage on aspects ratios ranging from approximately 2:1 to approximately 200:1, and preferably from approximately 20:1 to approximately 100:1. Additionally, the disclosed Group V (five) element-containing film forming compositions have high decomposition temperatures, indicating good thermal stability to enable ALD. The high decomposition temperatures permit ALD at higher temperatures, resulting in films having higher purity.

The disclosed method may be useful in the manufacture of semiconductor, photovoltaic, LCD-TFT, flat panel type devices. The disclosed Group V (five) element-containing film forming compositions may be used to deposit Group V (five) element-containing films using any deposition methods known to those of skill in the art. Examples of suitable vapor deposition methods include chemical vapor deposition (CVD), atomic layer deposition (ALD). Exemplary CVD methods include thermal CVD, plasma enhanced CVD (PECVD), pulsed CVD (PCVD), low pressure CVD (LPCVD), sub-atmospheric CVD (SACVD), atmospheric pressure CVD (APCVD), hot-wire CVD (HWCVD, also known as cat-CVD, in which a hot wire serves as an energy source for the deposition process), radicals incorporated CVD, and combinations thereof. Exemplary ALD methods include thermal ALD, plasma enhanced ALD (PEALD), spatial ALD, hot-wire ALD (HWALD), radicals incorporated ALD, and combinations thereof. Super critical fluid deposition may also be used. The deposition method is preferably ALD, PE-ALD, spatial ALD in order to provide suitable step coverage and film thickness control, The disclosed Group V (five) element-containing film forming compositions may be supplied either in neat form or in a blend with a suitable solvent, such as ethyl benzene, xylene, mesitylene, decalin, decane, dodecane. The disclosed precursors may be present in varying concentrations in the solvent.

The neat or blended Group V (five) element-containing Group V (five) element-containing film forming compositions are introduced into a reactor in vapor form by conventional means, such as tubing and/or flow meters. The vapor form may be produced by vaporizing the neat or blended composition through a conventional vaporization step such as direct vaporization, distillation, by bubbling, or by using a sublimator, such as the one disclosed in PCT Publication WO2009/087609 to Xu et al. The neat or blended composition may be fed in liquid state to a vaporizer where it is vaporized before it is introduced into the reactor. Alternatively, the neat or blended composition may be vaporized by passing a carrier gas into a container containing the composition by bubbling the carrier gas into the composition. The carrier gas may include, but is not limited to, Ar, He, N$_2$, and mixtures thereof. Bubbling with a carrier gas may also remove any dissolved oxygen present in the neat or blended composition. The carrier gas and composition are then introduced into the reactor as a vapor.

If necessary, the container containing the disclosed Group V (five) element-containing film forming composition may be heated to a temperature that permits the composition to be in its liquid phase and to have a sufficient vapor pressure. The container may be maintained at temperatures in the range of, for example, approximately 0° C. to approximately 200° C. Those skilled in the art recognize that the temperature of the container may be adjusted in a known manner to control the amount of precursor vaporized.

The reactor may be any enclosure chamber within a device in which deposition methods take place such as without limitation, a parallel-plate type reactor, a cold-wall type reactor, a hot-wall type reactor, a single-wafer reactor, a multi-wafer reactor, other types of deposition systems under conditions suitable to cause the compounds to react and form the layers. One of ordinary skill in the art will recognize that any of these reactors may be used for either ALD or CVD deposition processes.

The reactor contains one or more substrates onto which the films will be deposited. A substrate is generally defined as the material on which a process is conducted. The substrates may be any suitable substrate used in semiconductor, photovoltaic, flat panel, LCD-TFT device manufacturing. Examples of suitable substrates include wafers, such as silicon, silica, glass, GaAs wafers. The wafer may have one or more layers of differing materials deposited on it from a previous manufacturing step. For example, the wafers may include a dielectric layer. Furthermore, the wafers may include silicon layers (crystalline, amorphous, porous, etc.), silicon oxide layers, silicon nitride layers, silicon oxy nitride layers, carbon doped silicon oxide (SiCOH) layers, metal, metal oxide, metal nitride layers (Ti, Ru, Ta, etc.) combinations thereof. Additionally, the wafers may include copper layers, noble metal layers (e.g., platinum, palladium, rhodium, gold). The wafers may include barrier layers, such as manganese, manganese oxide, etc. Plastic layers, such as poly(3,4-ethylenedioxythiophene)poly(styrenesulfonate) [PEDOT:PSS] may also be used. The layers may be planar or patterned. The disclosed processes may deposit the Group V (five) element-containing layer directly on the wafer or directly on one or more layers on top of the wafer (when patterned layers form the substrate). Furthermore, one of ordinary skill in the art will recognize that the terms "film" "layer" used herein refer to a thickness of some material laid on spread over a surface and that the surface may be a trench and/or a line. Throughout the specification and claims, the wafer and any associated layers thereon are referred to as substrates. For example, a Niobium oxide film may be deposited onto a metal oxide layer, such as a $ZrO_2$ layer, an $HfO_2$ layer, a $MoO_2$ layer. In subsequent processing, another metal oxide layer may be deposited on the Niobium oxide layer to form a laminate; for example, $ZrO_2/Nb_2O_5/ZrO_2$ laminate dielectric stack are typical of DRAM high-k stack. A conductive metal nitride layer, such as a Niobium Nitride layer or a Titanium Nitride layer, may be deposited before or on the last metal oxide layer to form, respectively, the bottom and top electrodes. The resulting $NbN/ZrO_2O_5/ZrO_2/NbN$ stack may be used in DRAM capacitors. Other conductive films, such as RuO, Ru, Pt, Ir, WN, WNC, may be also used as the bottom and top electrodes, alone or in addition to the NbN or TaN layers.

The substrate may also be a powder, such as the powder used in rechargeable battery technology. A non-limiting number of powder materials include NMC (Lithium Nickel Manganese Cobalt Oxide), LCO (Lithium Cobalt Oxide), LFP (Lithium Iron Phosphate), and other battery cathode materials.

The temperature and the pressure within the reactor are held at conditions suitable for ALD. In other words, after introduction of the vaporized disclosed composition into the chamber, conditions within the chamber are such that at least part of the precursor is deposited onto the substrate to form a Group V (five) element-containing layer. For instance, the pressure in the reactor or the deposition pressure may be held between about 10-3 torr and about 100 Torr, more preferably between about 10-2 and 100 Torr, as required per the deposition parameters. Likewise, the temperature in the reactor or the deposition temperature may be held between about 100° C. and about 600° C., preferably between about 150° C. and about 500° C. One of ordinary skill in the art will recognize that "at least part of the precursor is deposited" means that some or all of the precursor reacts with and adheres to the substrate.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 50° C. to approximately 600° C. When a plasma deposition process is utilized, the deposition temperature may range from approximately 150° C. to approximately 500° C. Alternatively, when a thermal process is performed, the deposition temperature may range from approximately 100° C. to approximately 600° C.

In addition to the disclosed Group V (five) element-containing film forming composition, a co-reactant may be introduced into the reactor. When the target is a conductive film, the co-reactant may be $H_2$, $H_2CO$, $N_2H_4$, $NH_3$, a primary amine, a secondary amine, a tertiary amine, trisilylamine, radicals thereof, and mixtures thereof. Preferably, the co-reactant is $H_2$ or $NH_3$.

Alternatively, when the target is a dielectric film, the co-reactant may be an oxidizing gas such as one of $O_2$, $O_3$, $H_2O$, $H_2O_2$, NO, $N_2O$, $NO_2$, oxygen containing radicals such as O—, OH—, carboxylic acids, formic acid, acetic acid, propionic acid, and mixtures thereof. Preferably, the oxidizing gas is selected from the group consisting of $O_3$, $H_2O_2$ and $H_2O$.

The co-reactant may be treated by a plasma, in order to decompose the reactant into its radical form, $N_2$ may also be utilized as a nitrogen source gas when treated with plasma. For instance, the plasma may be generated with a power ranging from about 10 W to about 1000 W, preferably from about 50 W to about 500 W. The plasma may be generated present within the reactor itself. Alternatively, the plasma may generally be at a location removed from the reactor, for instance, in a remotely located plasma system. One of skill in the art will recognize methods and apparatus suitable for such plasma treatment.

For example, the co-reactant may be introduced into a direct plasma reactor, which generates plasma in the reaction chamber, to produce the plasma-treated reactant in the reaction chamber. Exemplary direct plasma reactors include the Titan™ PECVD System produced by Trion Technologies. The co-reactant may be introduced and held in the reaction chamber prior to plasma processing. Alternatively, the plasma processing may occur simultaneously with the introduction of the reactant. In-situ plasma is typically a 13.56 MHz RF inductively coupled plasma that is generated between the showerhead and the substrate holder. The substrate or the showerhead may be the powered electrode depending on whether positive ion impact occurs. Typical applied powers in in-situ plasma generators are from approximately 30 W to approximately 1000 W. Preferably, powers from approximately 30 W to approximately 600 W are used in the disclosed methods. More preferably, the powers range from approximately 100 W to approximately 500 W. The disassociation of the co-reactant using in-situ plasma is typically less than achieved using a remote plasma source for the same power input and is therefore not as efficient in reactant dissociation as a remote plasma system, which may be beneficial for the deposition of Group V (five) element-containing films on substrates easily damaged by plasma.

Alternatively, the plasma-treated co-reactant may be produced outside of the reaction chamber, for example, a remote plasma to treat the co-reactant prior to passage into the reaction chamber.

The ALD conditions within the chamber allow the disclosed Group V (five) element-containing film forming composition adsorbed chemisorbed on the substrate surface to react and form a Group V (five) element-containing film on the substrate. In some embodiments, Applicants believe that plasma-treating the co-reactant may provide the co-reactant with the energy needed to react with the disclosed Group V (five) element-containing film forming composition.

Depending on what type of film is desired to be deposited, an additional precursor compound may be introduced into the reactor. The additional precursor may be used to provide additional elements to the Group V (five) element-containing film. The additional elements may include Group I elements (lithium, Sodium, potassium), lanthanides (Ytterbium,Erbium, Dysprosium, Gadolinium, Praseodymium, Cerium, Lanthanum, Yttrium), Group IV elements (zirconium, titanium, hafnium), main group elements (germanium, silicon, aluminium), additional different Group V elements, and mixtures thereof. When an additional precursor compound is utilized, the resultant film deposited on the substrate contains the Group V metal in combination with an additional element. When the additional precursor and the Group V precursors are used in more than one ALD super cycle sequences, a nanolaminate film is obtained. For instance, when an additional Li-containing precursor is used, the Group V (five) element-containing film will contain Li, such as, a lithium niobate ($LiNbO_3$) film. One of ordinary skilled in the art will recognize the Group V (five) element-containing films containing Li may be formed by ALD on any types of substrates including a powder.

The Group V (five) element-containing film forming composition and co-reactants may be introduced into the reactor sequentially (atomic layer deposition). The reactor may be purged with an inert gas between the introduction of each of the Group V (five) element-containing film forming composition, any additional precursors, and the co-reactants. Another example is to introduce the co-reactant continuously and to introduce the Group V (five) element-containing film forming composition by pulse, while activating the co-reactant sequentially with a plasma, provided that the Group V (five) element-containing film forming composition and the non-activated co-reactant do not substantially react at the chamber temperature and pressure conditions (CW PEALD).

Each pulse of the disclosed Group V (five) element-containing film forming composition may last for a time period ranging from about 0.01 seconds to about 120 seconds, alternatively from about 1 seconds to about 80 seconds, alternatively from about 5 seconds to about 30 seconds. The co-reactant may also be pulsed into the reactor, In such embodiments, the pulse of each may last for a time period ranging from about 0.01 seconds to about 120 seconds, alternatively from about 1 seconds to about 30 seconds, alternatively from about 2 seconds to about 20 seconds. In another alternative, the vaporized Group V (five) element-containing film forming compositions and co-reactants may be simultaneously sprayed from different sectors of a shower head (without mixing of the composition and the reactant) under which a susceptor holding several wafers is spun (spatial ALD).

Depending on the particular process parameters, deposition may take place for a varying length of time. Generally, deposition may be allowed to continue as long as desired necessary to produce a film with the necessary properties. Typical film thicknesses may vary from several angstroms to several hundreds of microns, and typically from 2 to 100 nm, depending on the specific deposition process. The deposition process may also be performed as many times as necessary to obtain the desired film.

In one non-limiting exemplary ALD process, the vapor phase of the disclosed Group V (five) element-containing film forming composition is introduced into the reactor, where it is contacted with a suitable substrate. Excess composition may then be removed from the reactor by purging and/or evacuating the reactor. A co-reactant (for example, $O_3$) is introduced into the reactor where it reacts with the absorbed Group V (five) element-containing film forming composition in a self-limiting manner. Any excess co-reactant is removed from the reactor by purging and/or evacuating the reactor. If the desired film is a Group V (five) element-containing oxide, this two-step process may provide the desired film thickness and may be repeated until a film having the necessary thickness has been obtained.

Alternatively, if the desired film contains the Group V (five) transition metal and a second element, such as Li, the two-step process above may be followed by introduction of the vapor of an additional precursor compound into the reactor. The additional precursor compound will be selected based on the nature of the Group V (five) element-containing film being deposited. After introduction into the reactor, the additional precursor compound is contacted with the substrate. Any excess precursor compound is removed from the reactor by purging and/or evacuating the reactor. Once again, a co-reactant may be introduced into the reactor to react with the precursor compound. Excess co-reactant is removed from the reactor by purging and/or evacuating the reactor. If a desired film thickness has been achieved, the process may be terminated. However, if a thicker film is desired, the entire four-step process may be repeated. By alternating the provision of the Group V (five) element-containing film forming composition, additional precursor compound, and co-reactant, a film of desired composition and thickness can be deposited. In one non-limiting exemplary ALD process, the vapor phase of one of the disclosed Group V (five) element-containing film forming for composition, example (t-butylimido) (methylcyclopentadienyl) bis(isopropylpyrazolate) Niobium (V), $Nb(=NtBu)(MeCp)(iPr-pyz)_2$, is introduced into the reactor, where it is contacted with a powder substrate. Excess composition may then be removed from the reactor by purging and/or evacuating the reactor. A co-reactant (for example, $O_3$) is introduced into the reactor where it reacts with the absorbed $Nb(=NtBu)(MeCp)(iPr-pyz)_2$ in a self-limiting manner to form a Nb oxide film. Any excess $O_3$ gas is removed from the reactor by purging and/or evacuating the reactor. A Li-containing precursor may then be exposed to the powder substrate and/or the Nb oxide film to form a Li and Nb oxide film $LiNbO_3$. For example, LiOtBu, may serve as the Li precursor. This non-limiting exemplary ALD process described above using $Nb(=NtBu)(MeCp)(iPr-pyz)_2$, $O_3$ and LiOtBu may then be repeated on the powder until a desired thickness of the $LiNbO_3$ film is deposited on the powder. The resulting $LiNbO_3$ film may be used in rechargeable battery applications. One of ordinary skilled in the art will recognize that the suitable lithium precursors include, but are not limited to, LiOtBu, $LiN(SiR_3)_2$ wherein each R is selected from H, a $C_1$ to $C_4$ alkyl or alkenyl group, Li(DPM) (lithium dipivaloylmethane aka lithium 2,2,6,6-tetramethyl-3,5-heptanedionate) or any other suitable lithium ALD precursors.

When the co-reactant in this exemplary ALD process is treated with a plasma, the exemplary ALD process becomes an exemplary PEALD process. The co-reactant may be treated with plasma prior to or subsequent to introduction into the chamber.

In a second non-limiting exemplary ALD process, the vapor phase of one of the disclosed Group V (five) element-containing film forming composition, for example (t-butylimido) (methylcyclopentadienyl)bis(isopropylpyrazolate) Niobium (V), $Nb(=NtBu)(MeCp)(iPr-pyz)_2$, is introduced into the reactor, where it is contacted with a Si substrate. Excess composition may then be removed from the reactor by purging and/or evacuating the reactor. A co-reactant (for example, $O_3$) is introduced into the reactor where it reacts with the absorbed Group V (five) element-containing film forming composition in a self-limiting manner to form a Group V (five) element-containing oxide film. Any excess $O_3$ gas is removed from the reactor by purging and/or evacuating the reactor. These two steps may be repeated until the Group V (five) element-containing oxide film obtains a desired thickness, typically around 10 angstroms, $ZrO_2$ may then be deposited on the Group V (five) element-containing oxide film. For example, $ZrCp(NMe_2)_3$ may serve as the Zr precursor. The second non-limiting exemplary ALD process described above using Nb(=NtBu)(MeCp)(iPr-pyz)$_2$ and $O_3$ may then be repeated on the $ZrO_2$ layer. The resulting $Nb_2O_5/ZrO_2/Nb_2O_5$ stack may be used in DRAM capacitors.

In another exemplary ALD process, another precursor may be introduced sequentially between one or several ALD super-cycles (e.g., O-containing co-reactant/Group V (five) element-containing precursor/O-containing co-reactant) in order to deposit a Group V (five) element-containing MO film an Group V (five) element-containing O/MO nanolaminate, M being selected from a Group IV element, a different group V (five) element, silicon, germanium, aluminium, or any lanthanide. The M precursor selected preferably undergoes ALD growth in the same temperature window exhibited by the selected Group V (five) element-containing film forming composition.

The Group V (five) element-containing films resulting from the processes discussed above may include Nb, $Nb_kSi_l$, $Nb_nO_m$, $Nb_oN_p$, $Nb_oN_pO_q$, wherein k, l, m, n, o, p, and q may each independently range from 1 to 6. Exemplary films include NbO2, $Nb_2O_5$, NbN, and NbON. One of ordinary skill in the art will recognize that by appropriate selection of the Group V (five) element-containing film forming composition and co-reactants, the desired film composition may be obtained. The Group V (five) element-containing films may provide suitable step coverage for capacitor electrodes in DRAM, the gate metal in 3D Flash memory devices, the heating element in phase change memory, the electromigration barrier layer, gate metal, and contact layers in logic devices.

Upon obtaining a desired film thickness, the film may be subject to further processing, such as thermal annealing, furnace-annealing, rapid thermal annealing, UV, e-beam curing, and/or plasma gas exposure. Those skilled in the art recognize the systems and methods utilized to perform these additional processing steps. For example, the $Nb_2O_5$ film may be exposed to a temperature ranging from approximately 200° C. to approximately 1000° C. for a time ranging from approximately 0.1 second to approximately 7200 seconds under an inert atmosphere, an O-containing atmosphere, combinations thereof. Most preferably, the temperature is 400° C. for 3600 seconds under an inert atmosphere or an O-containing atmosphere. The resulting film may contain fewer impurities and therefore may have an improved density resulting in improved leakage current. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially thermal annealing, has been found effective to reduce carbon and nitrogen contamination of the $Nb_2O_5$ film. This in turn tends to improve the resistivity of the film.

After annealing, the Group V (five) element-containing films deposited by any of the disclosed processes may have a bulk resistivity at room temperature of approximately 50 ohm, cm to approximately 1,000 uohm,cm. Room temperature is approximately 20° C. to approximately 28° C. depending on the season. Bulk resistivity is also known as volume resistivity. One of ordinary skill in the art will recognize that the bulk resistivity is measured at room temperature on the Group V (five) element-containing films that are typically approximately 50 nm thick. The bulk resistivity typically increases for thinner films due to changes in the electron transport mechanism. The bulk resistivity also increases at higher temperatures.

In another alternative, the disclosed compositions may be used as doping implantation agents. Part of the disclosed Group V (five) element-containing film forming composition may be deposited on top of the film to be doped, such as an indium oxide ($In_2O_3$) film, tantalum dioxide ($TaO_2$), vanadium dioxide ($VO_2$) film, a titanium oxide film, a copper oxide film, or a tin dioxide ($SnO_2$) film. The Group V (five) element, for example Nb, then diffuses into the film during an annealing step to form the Group V (five) element-doped films, such as {(Nb)$In_2O_3$, (Nb)$VO_2$, (Nb)TiO, (Nb)CuO, (Nb)$SnO_2$}. See, e.g., US2008/0241575 to Lavoie et al., the doping method of which is incorporated herein by reference in its entirety.

EXAMPLES

The following non-limiting examples are provided to further illustrate embodiments of the invention. However, the examples are not intended to be all inclusive and are not intended to limit the scope of the inventions described herein.

Example 1. Synthesis of Nb(=NtBu)(MeCp)(Me,H,Me-pyz)$_2$ (Me,H,Me-pyz) H (1 g, 10.40 mmol) was slowly added to a solution of Nb(=NtBu)(MeCp)(NEt2)$_2$ (2 g, 5.16 mmol) in about 60 ml of toluene at room temperature. After stirring at room temperature overnight, the solvent and volatiles were removed under vacuum to obtain a very viscous yellow oil, which subsequently became a crystalline solid. The crystalline solid was then washed with anhydrous pentane and dried to obtain yellow crystals, Nb(=NtBu)(MeCp)(Me,H,Me-pyz)$_2$. The yield=1.35 g.

Figure 2:
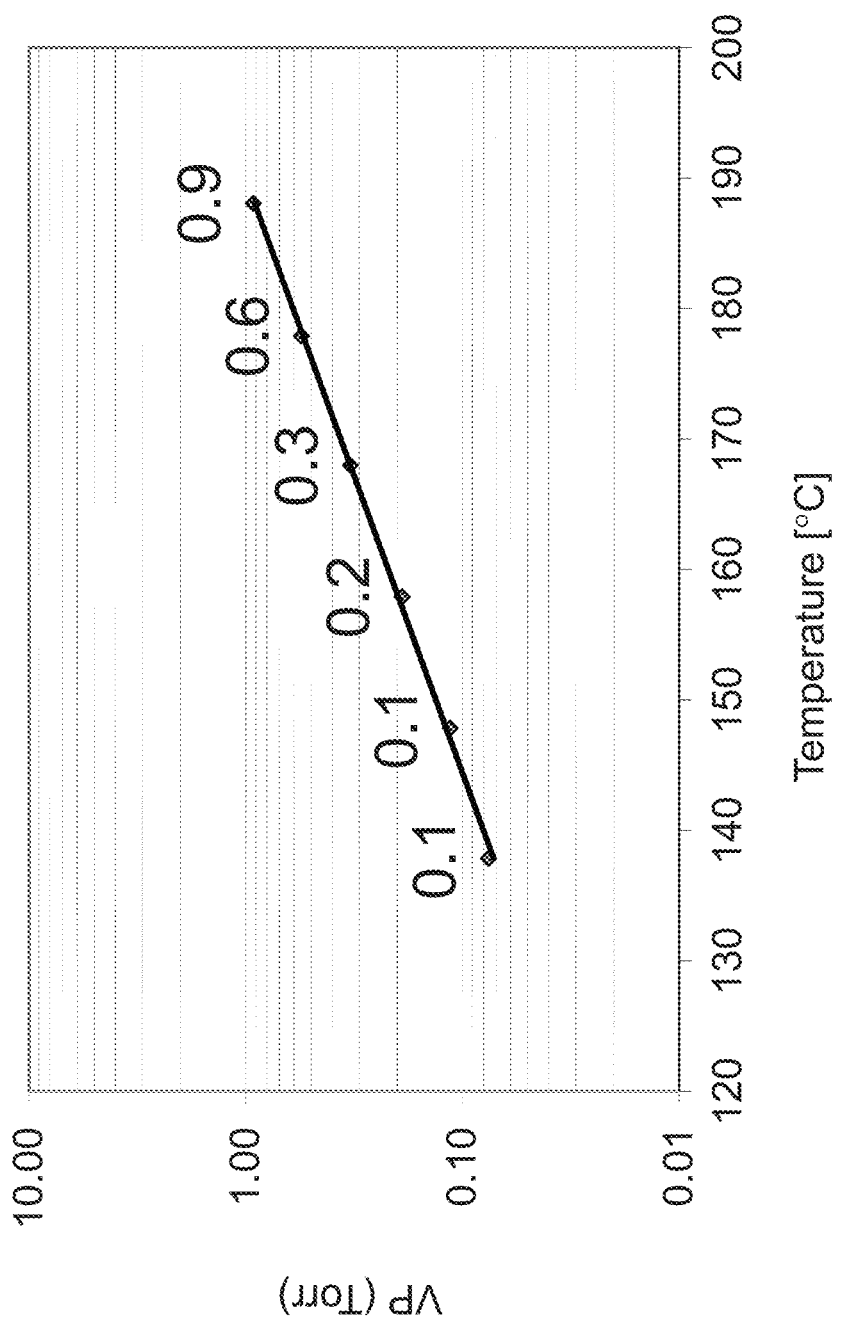
FIG. 2 is a vapor pressure (VP) curve of Nb(=NtBu)(MeCp)(Me,H,Me-pyz)$_2$.
Figure 3:
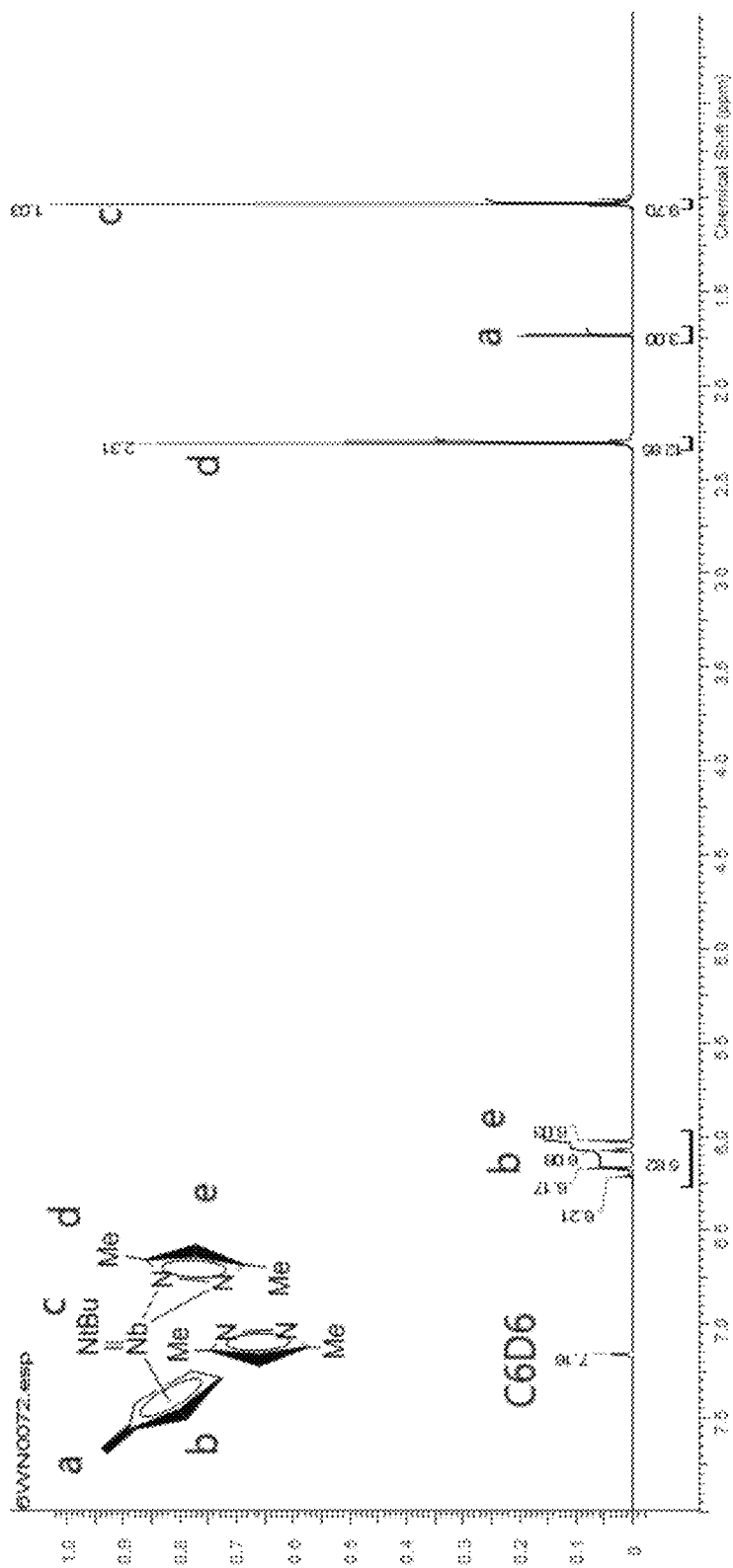
FIG. 3 is 1H NMR of Nb(=NtBu)(MeCp)(Me,H,Me-pyz)$_2$.

The TGA of the synthesized Nb(=NtBu)(MeCp)(Me, H, Me-pyz)$_2$ is shown in FIG. 1. The TGA graph shows clean evaporation with a low (<4.37%) remaining residue at a temperature approximately 300° C. In addition, after TGA, no material remained in the TG pan. FIG. 2 is a vapor pressure graph of Nb(=NtBu)(MeCp)(Me,H,Me-pyz)$_2$. The vapor pressure at 1 Torr is approximately 190° C. The NMR 1H spectrum is provided in FIG. 3.

Example 2. Synthesis of Nb(=NtBu)(MeCp)(iPr,H,iPr-pyz) 2

A solution of (iPr, H,iPr-pyz) H (34 g, 0.22 mol) in toluene was slowly added to a solution of Nb(=NtBu)(MeCp)(NEt2)$_2$ (43 g, 0.11 mol) in about 300 mL of toluene at room temperature. After stirring at room temperature overnight, the solvent and volatiles were removed under vacuum to obtain a very viscous yellow oil. It was then subject to vacuum distillation to obtain a yellow oil, Nb(=NtBu)(MeCp)(iPr,H,iPr-pyz)$_2$. The yield=34 g.

Figure 4:
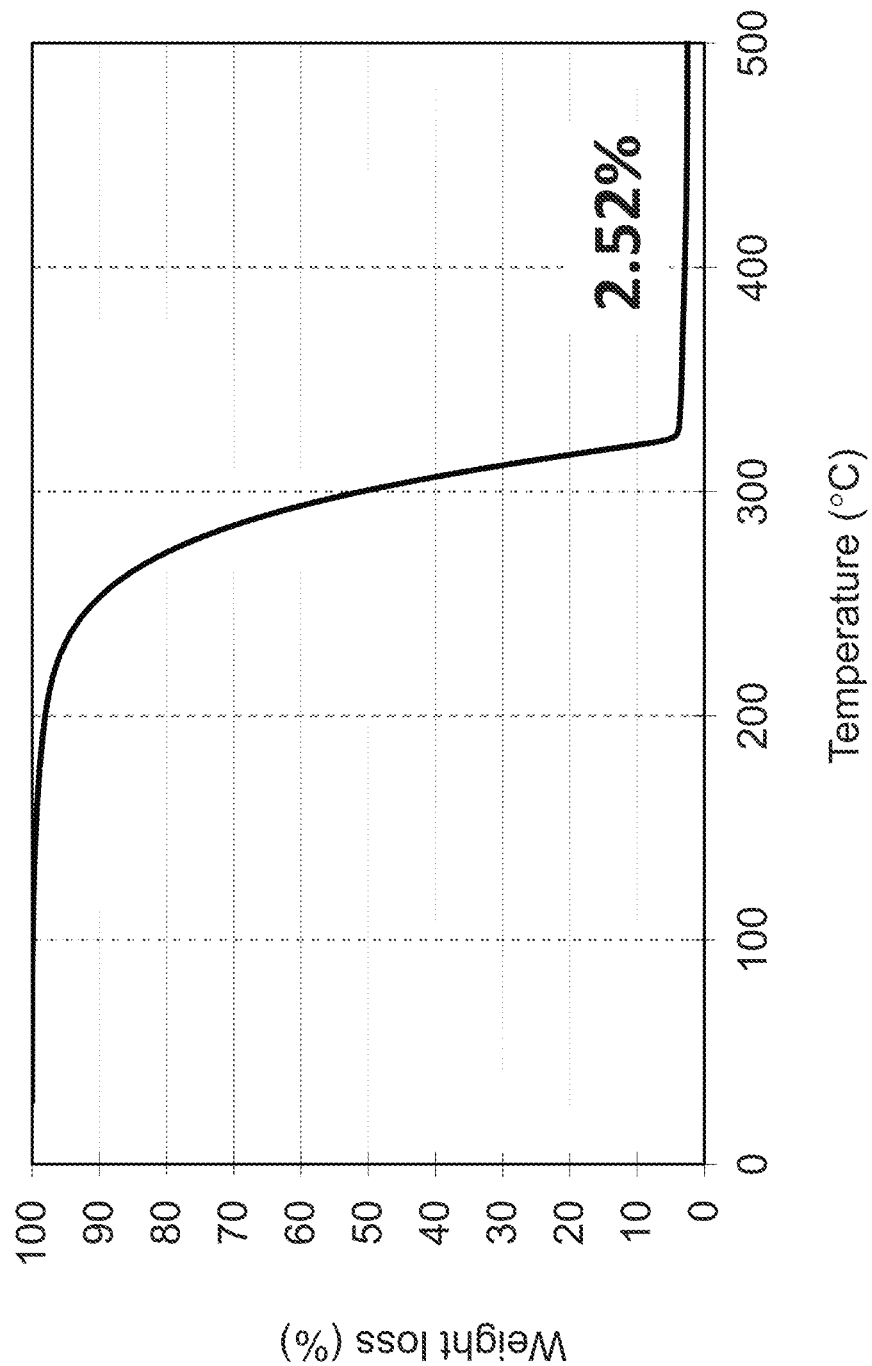
FIG. 4 is a TGA curve of Nb(=NtBu)(MeCp)(iPr,H,iPr-pyz)$_2$.
Figure 5:
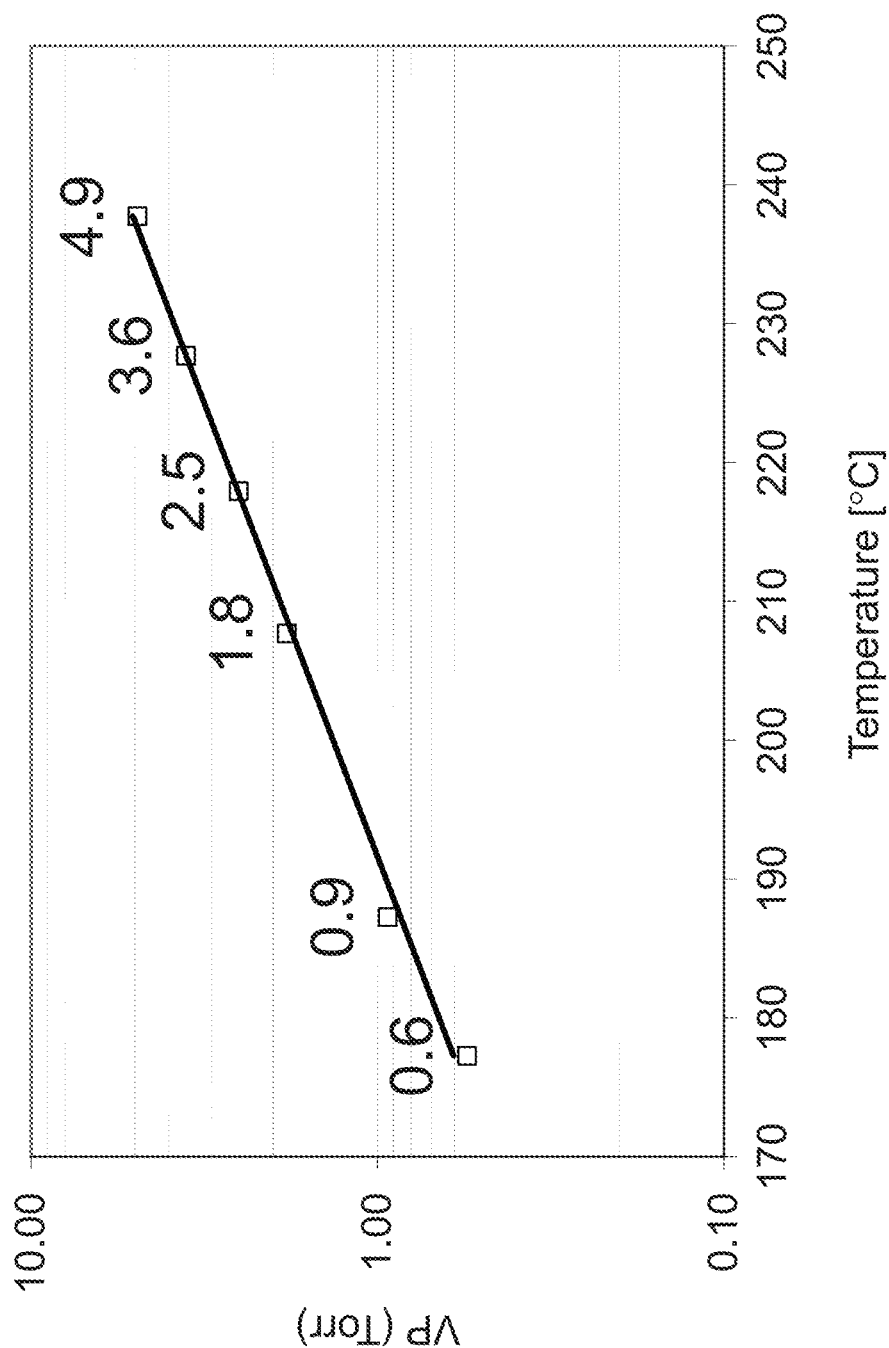
FIG. 5 is a VP curve of Nb(=NtBu)(MeCp)(iPr,H,iPr-pyz)$_2$.
Figure 6:
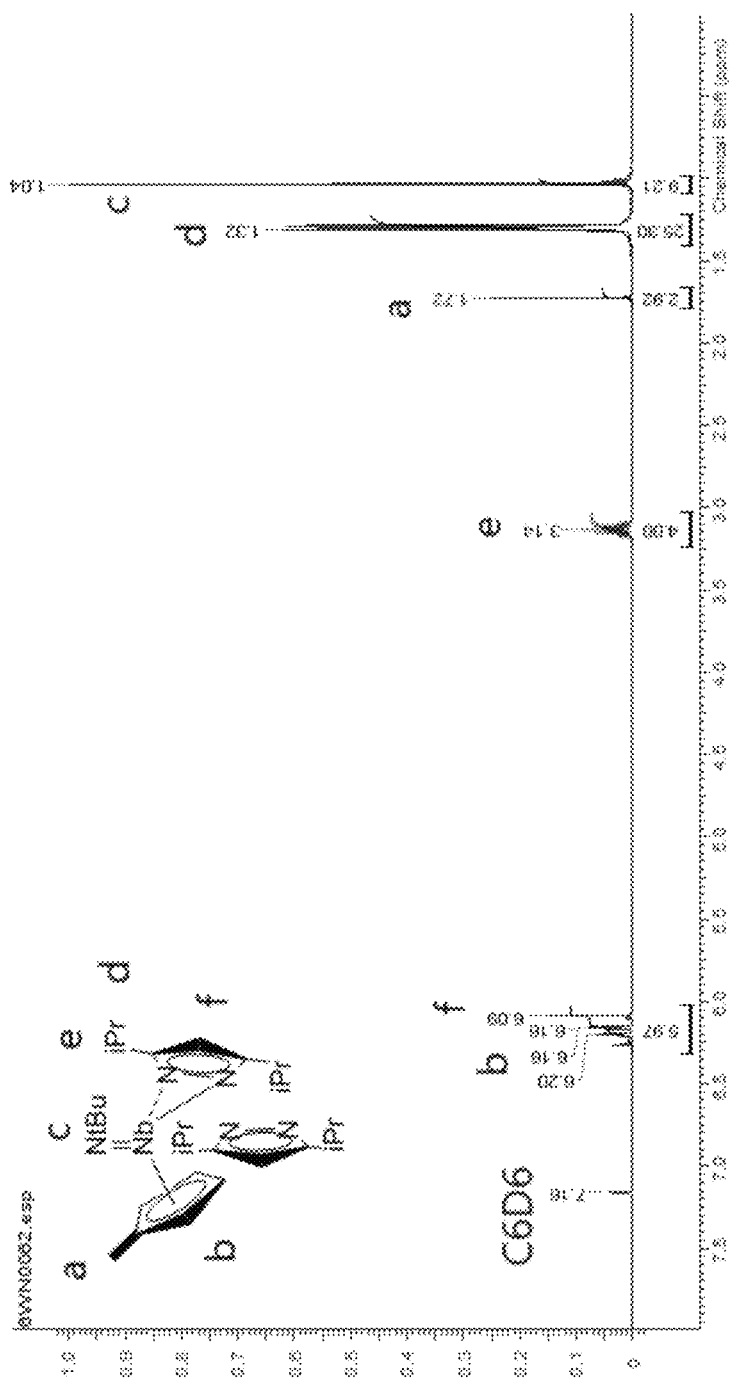
FIG. 6 is 1H NMR diagram of Nb(=NtBu)(MeCp)(iPr,H,iPr-pyz)$_2$.

The TGA of the synthesized Nb(=NtBu)(MeCp)(iPr,H, iPr-pyz)$_2$ is shown in FIG. 4. The TGA graph shows clean evaporation with a low (<2.52%) remaining residue at approximately 320° C. In addition, after TGA, no material remained in the TG pan. FIG. 5 is a vapor pressure graph of Nb(=NtBu)(MeCp)(iPr,H,iPr-pyz)$_2$. The vapor pressure at 1 Torr is approximately 190° C. and the vapor pressure at 5 Torr is approximately 238° C. The NMR 1H spectrum is provided in FIG. 6.

Example 3. ALD of Nb$_2$O$_5$ film using Nb(=NtBu)(MeCp)(iPr, H,iPr-pyz)$_2$

Figure 7:
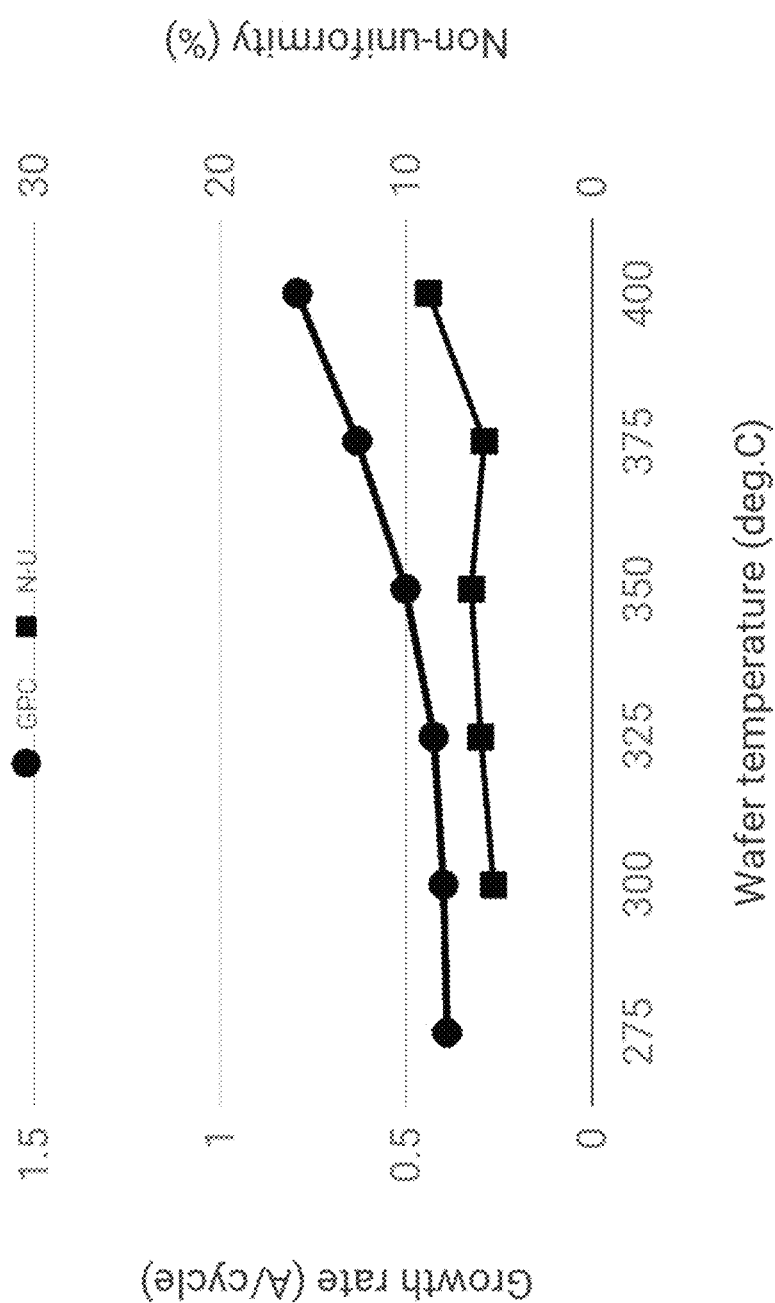
FIG. 7 is ALD temperature window of Nb(=NtBu)(MeCp)(iPr,H,iPr-pyz)$_2$ with ozone.
Figure 8:
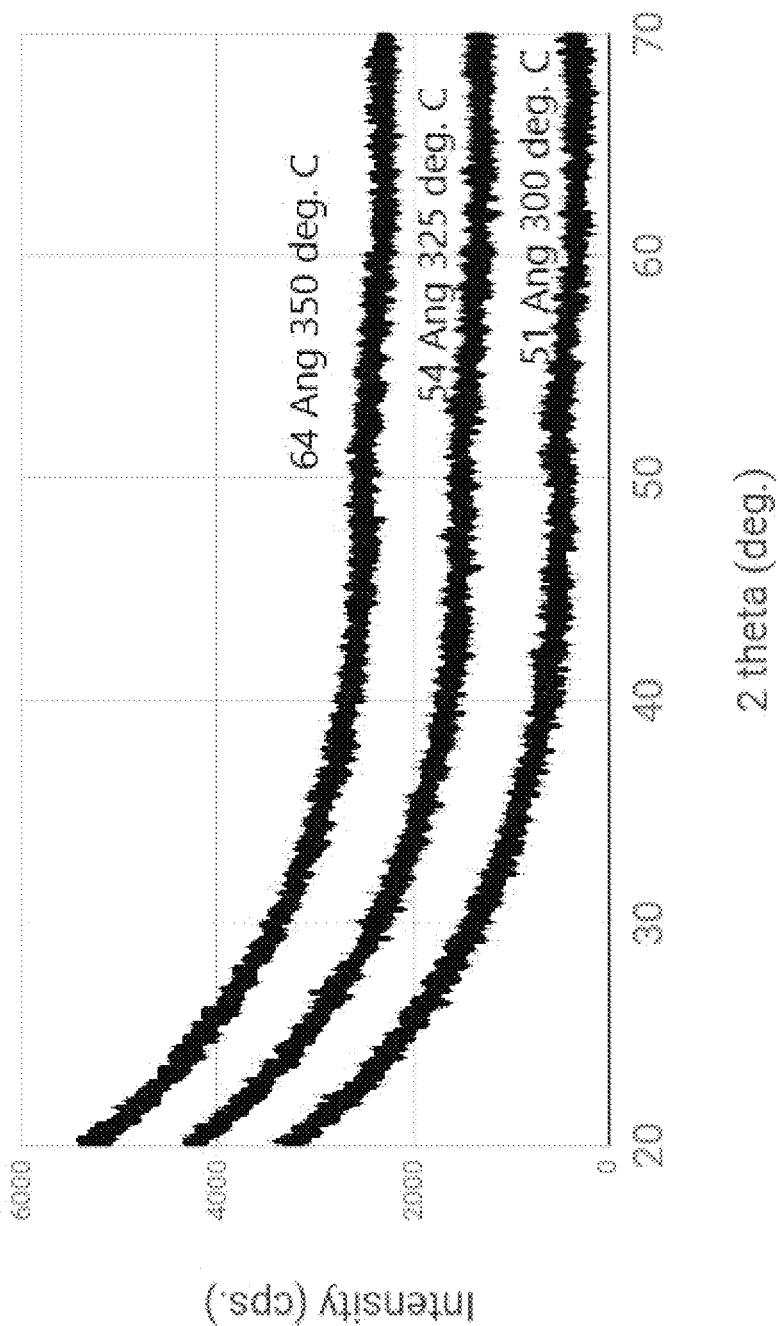
FIG. 8 is X-Ray Diffractions (XRDs) of Nb$_2$O$_5$ deposited by Nb(=NtBu)(MeCp) (iPr,H,iPr-pyz)$_2$ with ozone.
Figure 9:
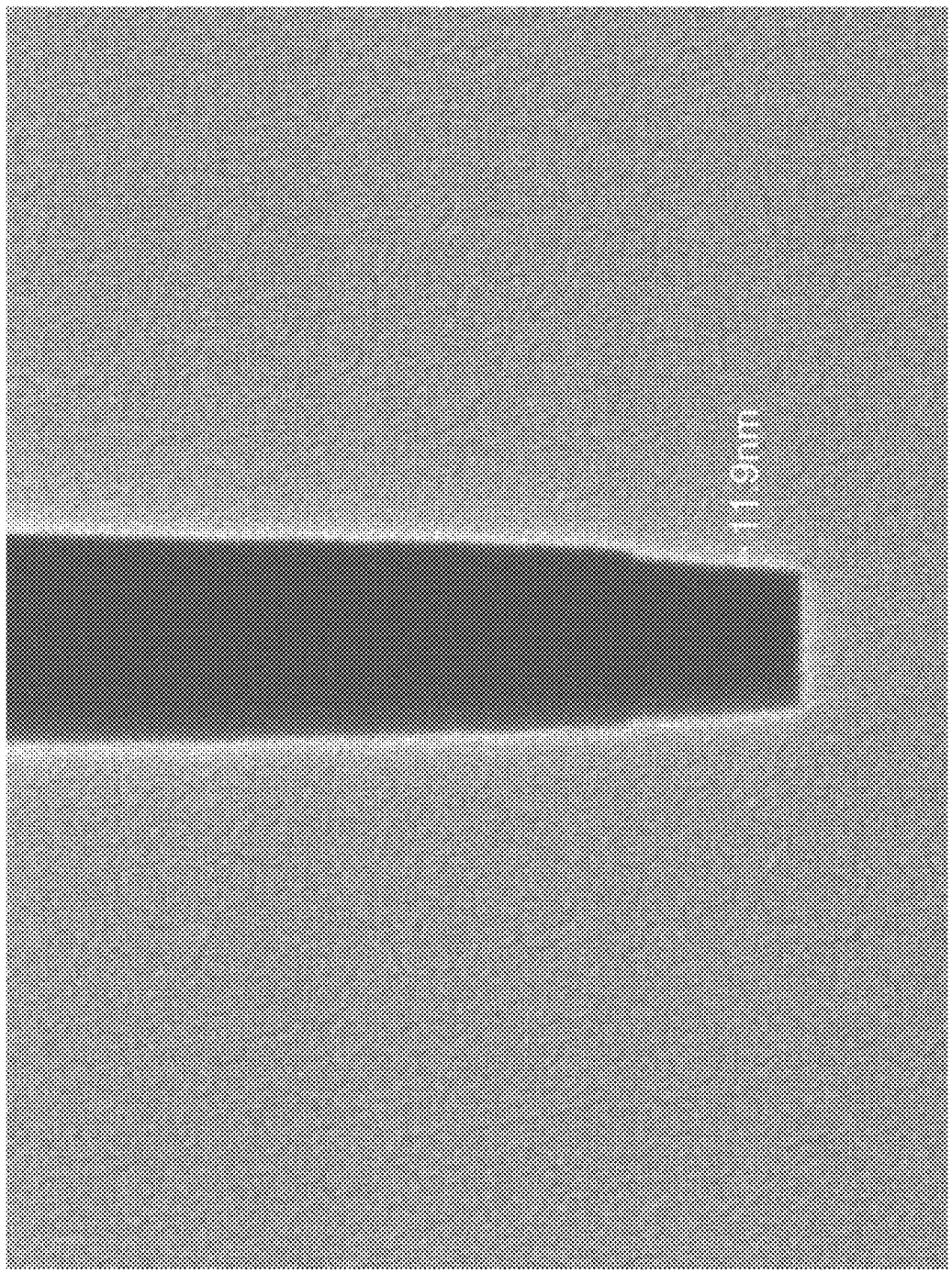
FIG. 9 is a Scanning Electron Microscopy (SEM) of Nb$_2$O$_5$ deposited in a patterned structure by Nb(=NtBu)(MeCp)(iPr,H,iPr-pyz)$_2$ with ozone.

ALD deposition using precursor Nb(=NtBu)(MeCp)(iPr, H,iPr-pyz)$_2$ and co-reactant O$_3$ was performed on Si substrates. The canister containing Nb(=NtBu)(MeCp)(iPr, H,iPr-pyz)$_2$ was maintained at 95° C. The ALD chamber pressure was set at 1 Torr. The ALD process temperature was set at temperatures ranging from approximately 275° C. to approximately 400° C. These results are shown in FIG. 7, which is a graph showing the formed Nb$_2$O$_5$ film growth rate as a function of the chamber temperature using Nb(=NtBu)(MeCp)(iPr,H,iPr-pyz)$_2$. ALD deposition occurred at temperatures ranging from approximately 275° C. to approximately 350° C., where non-uniformity is low. FIG. 8 is X-Ray Diffractions (XRDs) of Nb$_2$O$_5$ deposited by Nb(=NtBu)(MeCp)(iPr, H,iPr-pyz)$_2$ with ozone. FIG. 9 is a photograph of SEM of Nb$_2$O$_5$ film deposited in a patterned structure by Nb(=NtBu)(MeCp)(iPr,H,iPr-pyz)$_2$ with O$_3$. The thickness of the deposited Nb$_2$O$_5$ film is approximately 11.9 nm.

Although the subject matter described herein may be described in the context of illustrative implementations to process one or more computing application features/operations for a computing application having user-interactive components the subject matter is not limited to these particular embodiments. Rather, the techniques described herein may be applied to any suitable type of user-interactive component execution management methods, systems, platforms, and/or apparatus.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for forming a Group V (five) element-containing film, the method comprising the steps of:
   a) exposing a substrate to a vapor of a Group V (five) element-containing film forming composition that comprises a precursor Nb(=NtBu)(MeCp)(iPr,H,iPr-Pyz)$_2$ or Nb(=NtBu)(MeCp)(Me,H,Me-Pyz)$_2$;
   b) exposing the substrate to a co-reactant; and
   c) repeating the steps of a) and b) until a desired thickness of the Group V (five) element-containing film is deposited on the substrate using a vapor deposition process.

2. The method of claim 1, further comprising the steps of introducing an inert gas purge following the steps a) and b), respectively, to separate each exposure, wherein the inert gas purge uses an inert gas selected from N$_2$, Ar, Kr, or Xe.

3. The method of claim 2, further comprising the step of plasma treating the co-reactant.

4. The method of claim 3, wherein the co-reactant is selected from the group consisting of O$_2$, O$_3$, H$_2$O, H$_2$O$_2$, NO, N$_2$O, NO$_2$, oxygen radicals thereof, and mixtures thereof.

5. The method of claim 4, wherein the co-reactant is selected from the group consisting of H$_2$, H$_2$CO, N$_2$H$_4$, NH$_3$, an amine, a hydrazine N(SiH$_3$)$_3$, radicals thereof, and mixtures thereof.

6. The method of claim 5, wherein the co-reactant is NH$_3$ or O$_3$.

7. The method of claim 6, wherein the Group V (five) element-containing film is a Nb$_2$O$_5$ film or a NbN film.

8. The method of claim 6, wherein the vapor deposition process is an ALD process or a CVD process.

9. The method of claim 6, wherein the vapor deposition process is a PEALD process or a spatial ALD process.

10. The method of claim 6, wherein a deposition temperature ranges from approximately 100° C. to approximately 600° C.

11. A Group V (five) element-containing film forming composition for a vapor deposition process comprising a precursor Nb(=NtBu)(MeCp)(iPr,H,iPr-Pyz)$_2$ or Nb(=NtBu)(MeCp)(Me,H,Me-Pyz)$_2$.

12. The Group V (five) element-containing film forming composition of claim 11, wherein the Group V (five) element-containing film forming composition comprises between approximately 95% w/w and approximately 100.0% w/w of the precursor.

13. The Group V (five) element-containing film forming composition of claim 11, wherein the Group V (five) element-containing film forming composition comprises between approximately 0.0% w/w and approximately 5.0% w/w impurities.

14. A method of forming a LiNbO$_3$ film or coating by an ALD process on a substrate, the method comprising the steps of:
   a) exposing the substrate to a vapor of a Group V (five) element-containing film forming composition that comprises a precursor Nb(=NtBu)(MeCp)(iPr,H,iPr-Pyz) 2 or Nb(=NtBu)(MeCp)(Me,H,Me-Pyz)$_2$;
   b) exposing the substrate to an oxidizer;
   c) exposing the substrate to a lithium-containing precursor;
   d) exposing the substrate to the oxidizer; and
   e) repeating the steps of a) to d) until a desired thickness of the LiNbO$_3$ film is deposited on the substrate using the ALD process,
   wherein the lithium-containing precursor is selected from the group consisting of LiOtBu; LiN(SiR$_3$)$_2$, wherein each R is selected from H, a C$_1$ to C$_4$ alkyl or an alkenyl group; and Li(DPM) (lithium dipivaloylmethane aka lithium 2,2,6,6-tetramethyl-3,5-heptanedionate).

15. The method of claim 14, further comprising the steps of introducing an inert gas purge following the steps a), b), c) and d), respectively, to separate each exposure.

16. The method of claim 14, wherein the substrate is a powder.

17. The method of claim 16, wherein the powder comprises one or more of NMC (Lithium Nickel Manganese Cobalt Oxide), LCO (Lithium Cobalt Oxide), LFP (Lithium Iron Phosphate), and other battery cathode materials.

\* \* \* \* \*